US011079440B2

(12) United States Patent
Ikeda et al.

(10) Patent No.: US 11,079,440 B2
(45) Date of Patent: Aug. 3, 2021

(54) MANAGEMENT DEVICE, ENERGY STORAGE MODULE, MANAGEMENT METHOD, AND COMPUTER PROGRAM

(71) Applicant: GS Yuasa International Ltd., Kyoto (JP)

(72) Inventors: Yuichi Ikeda, Kyoto (JP); Nan Ukumori, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 23 days.

(21) Appl. No.: 16/618,475

(22) PCT Filed: May 29, 2018

(86) PCT No.: PCT/JP2018/020557
§ 371 (c)(1),
(2) Date: Dec. 2, 2019

(87) PCT Pub. No.: WO2018/221514
PCT Pub. Date: Dec. 6, 2018

(65) Prior Publication Data
US 2020/0088807 A1    Mar. 19, 2020

(30) Foreign Application Priority Data

Jun. 2, 2017  (JP) .............................. JP2017-110326
May 24, 2018  (JP) .............................. JP2018-100003

(51) Int. Cl.
*H02J 7/00* (2006.01)
*G01R 31/3842* (2019.01)
(Continued)

(52) U.S. Cl.
CPC ...... *G01R 31/3842* (2019.01); *H01M 10/425* (2013.01); *H01M 10/48* (2013.01); *H02J 7/0047* (2013.01); *H01M 2010/4271* (2013.01)

(58) Field of Classification Search
CPC ............ G01R 31/3842; H01M 10/425; H01M 10/48; H01M 2010/4271; H02J 7/0047;
(Continued)

(56) References Cited

U.S. PATENT DOCUMENTS

2010/0036626 A1*  2/2010  Kang .................. G01R 31/392
                                                         702/63
2011/0215761 A1    9/2011  Mingant et al.
(Continued)

FOREIGN PATENT DOCUMENTS

JP    2001-231179 A    8/2001
JP    2004-271410 A    9/2004
(Continued)

OTHER PUBLICATIONS

International Searching Authority, International Search Report and Written Opinion for International Application No. PCT/JP2018/020557, dated Aug. 7, 2018, (7 pages), Japanese Patent Office, Tokyo, Japan.

*Primary Examiner* — Nathaniel R Pelton
*Assistant Examiner* — Mohammed J Sharief
(74) *Attorney, Agent, or Firm* — Alston & Bird LLP

(57) ABSTRACT

A management device is provided with an acquiring unit for acquiring the amount of variation between the voltage of a power storage element when conduction of power is suspended from a state in which power is being conducted to the power storage element and the voltage when a period has elapsed, and a determination unit for determining whether the amount of variation is included in a second range that corresponds to a first range in which the voltage difference between each power storage amount-voltage characteristic during charging and discharging for the same power storage amount is less than another range.

12 Claims, 17 Drawing Sheets

(51) Int. Cl.
*H01M 10/42* (2006.01)
*H01M 10/48* (2006.01)

(58) Field of Classification Search
CPC ...... H02J 7/0013; H02J 7/0014; H02J 7/0016; H02J 7/0024; H02J 7/0018; H02J 7/0019
USPC .................................. 324/433; 320/118, 119
See application file for complete search history.

(56) References Cited

U.S. PATENT DOCUMENTS

| | | |
|---|---|---|
| 2013/0038333 A1 | 2/2013 | Harada |
| 2013/0300425 A1* | 11/2013 | Shiraishi ............ G01R 31/3835 324/426 |
| 2013/0342212 A1 | 12/2013 | Kawahira et al. |
| 2014/0320141 A1 | 10/2014 | Kaburagi et al. |
| 2016/0372800 A1 | 12/2016 | Kanada |
| 2017/0368853 A1* | 12/2017 | Satake .................. H01M 10/48 |

FOREIGN PATENT DOCUMENTS

| | | |
|---|---|---|
| JP | 2012-507018 A | 3/2012 |
| JP | 2013-105519 A | 5/2013 |
| JP | 2014-006189 A | 1/2014 |
| JP | 2017-010727 A | 1/2017 |
| WO | WO-2011/132268 A1 | 10/2011 |
| WO | WO-2012/053075 A1 | 4/2012 |

* cited by examiner

A

B

A

B

MANAGEMENT DEVICE, ENERGY STORAGE MODULE, MANAGEMENT METHOD, AND COMPUTER PROGRAM

CROSS REFERENCE TO RELATED APPLICATIONS

This application is a national stage application, filed under 35 U.S.C. § 371, of International Application No. PCT/JP2018/020557, filed May 29, 2018, which international application claims priority to and the benefit of both Japanese Application No. 2017-110326, filed Jun. 2, 2017, and Japanese Application No. 2018-100003, filed May 24, 2018; the contents of all of which as are hereby incorporated by reference in their entirety.

BACKGROUND

Technical Field

The present invention relates to a management device that manages an energy storage device, an energy storage module, a management method, and a computer program.

Description of Related Art

There is a demand for a high capacity of a vehicle secondary battery used in an electric vehicle, a hybrid vehicle, and the like and an industrial secondary battery used in a power storage device, a solar power generating system, and the like. A positive electrode material having higher capacity than a current material is being developed in order to increase the capacity of the secondary battery. For example, a $Li_2MnO_3$-based active material is studied as a high-capacity positive electrode material.

Depending on a type of a material used for the electrode, sometimes the secondary battery has a characteristic called hysteresis that changes voltage or an electrochemical characteristic for the same state of charge (SOC) depending on charge history and discharge history. At this point, the SOC represents an electric quantity charged in the secondary battery with respect to the electric capacity of the secondary battery in terms of proportion, and is an example of a storage amount. A method for estimating the SOC in the secondary battery includes an open circuit voltage (OCV) method (voltage reference) for making a determination based on a correlation (SOC-OCV curve) in which an OCV and the SOC are correlated with each other in a one-to-one manner and a current integration method for making a determination by integrating a charge-discharge current value of the secondary battery.

When the SOC is calculated by the current integration method, the following equation (1) is used, assuming that the current SOC is $SOC_i$, the previous SOC is $SOC_{i-1}$, the current is $I_i$, the time interval is $\Delta t_i$, and the battery capacity (available capacity) is Q.

$$SOC_i = SOC_{i-1} + I_i \times \Delta t_i / Q \times 100 \quad (1)$$

When the current integration is continued for a long time, a measurement error of a current sensor is accumulated. The battery capacity decreases with time. For this reason, the estimation error of the SOC estimated by the current integration method increases with time. Conventionally, an OCV reset in which the SOC is estimated by the OCV method to reset the error accumulation is performed when the current integration is continued for a long time.

In the secondary battery having the hysteresis, the SOC is hardly estimated by the OCV method because the voltage is not uniquely decided with respect to the SOC. Dischargeable energy is hardly predicted at a certain point of time because the SOC-OCV curve is not uniquely decided. Even if the current integration method is adopted, the error is accumulated when current integration is continued, and OCV reset is hardly performed, so that the SOC is hardly estimated. Reference JP-A-2013-105519 discloses an example of a technique of estimating the SOC in the secondary battery having the hysteresis.

BRIEF SUMMARY

In the secondary battery having the hysteresis, the OCV value during the charge is not matched with the OCV value during the discharge with respect to the same SOC value. Among secondary batteries having the hysteresis, sometimes the hysteresis decreases under a condition that the OCV falls within a predetermined voltage range. A difference between the OCV during the charge and the OCV during the discharge with respect to the same SOC is small in a range where the hysteresis decreases. The OCV range where the hysteresis decreases is determined by a configuration of the secondary battery, such as a composition of an electrode material. In such a secondary battery, it is possible to estimate the SOC by the OCV method when the OCV falls within the range where the hysteresis decreases. However, because the voltage between the electrodes (CCV: Closed Circuit Voltage) of the operating secondary battery is different from the OCV, it is actually difficult to adopt the OCV method by detecting that the OCV falls within the range where the hysteresis decreases.

An object of the present invention is to provide a management device that manages the energy storage device containing the active material in which the storage amount-voltage characteristic exhibits the hysteresis, an energy storage module, a management method, and a computer program.

According to one aspect of the present invention, a management device includes: an acquisition unit that acquires a change amount between voltage of an energy storage device when energization is rested from a state in which the energy storage device is energized and voltage when a period elapses; and a determination unit that determines whether the change amount is included in a second range corresponding to a first range where a difference in voltage between a storage amount-voltage characteristic during charge and a storage amount-voltage characteristic during discharge with respect to an identical storage amount is smaller than another range.

In the present invention, it is possible to detect that the energy storage device falls within the range where the hysteresis decreases in a short time based on a change amount in voltage during resting of the energy storage device.

DETAILED DESCRIPTION OF VARIOUS EMBODIMENTS

Outline of Embodiment

Figure 1:
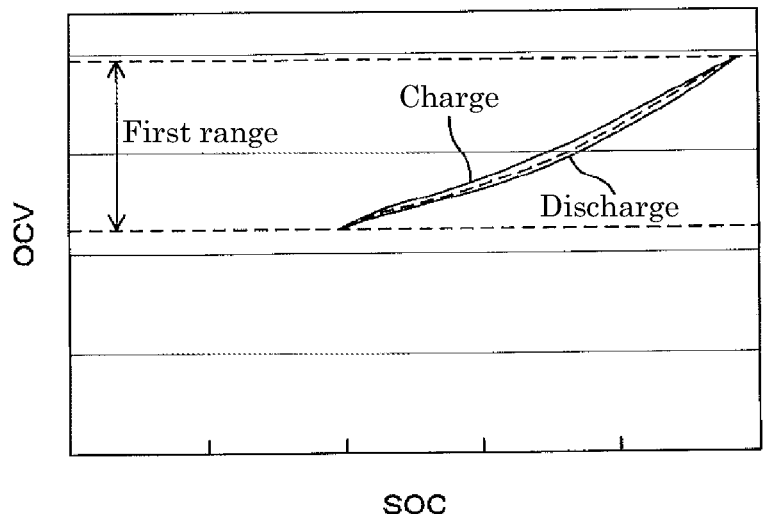
FIG. 1 is a graph illustrating an example of an SOC-OCV curve of an energy storage device.

A management device includes: an acquisition unit that acquires a change amount between voltage of an energy storage device when energization is rested from a state in which the energy storage device is energized and voltage when a period elapses; and a determination unit that determines whether the change amount is included in a second range corresponding to a first range where a difference in voltage between a storage amount-voltage characteristic during charge and a storage amount-voltage characteristic during discharge with respect to an identical storage amount is smaller than another range.

The management device acquires the change amount of the energy storage device in a resting state. In the description, a state in which a feeble current called a dark current is flowing in the energy storage device and a state similar to the state are included in the "resting state". When the acquired change amount is included in the second range, the management device may estimate the storage amount corresponding to the voltage based on the storage amount-voltage characteristic of the first range. As used herein, the storage amount means the SOC, a dischargeable amount of power, and the like. The case where the energy storage device is located in the first range is smaller than the case where the storage element is outside the first range in the change amount. For this reason, the case where the change amount is included in the second range can be estimated to be in the state in which the energy storage device is included in the first range. That the energy storage device is located in a small hysteresis range can be detected in a short time based on the change amount in the resting state of the energy storage device. The storage amount-voltage characteristic is substantially uniquely determined while the energy storage device is included in the first range. For this reason, the management device can estimate the storage amount using the storage amount-voltage characteristic.

In the energy storage device having the hysteresis, the energy that can be taken out by the discharge is smaller than the energy required for the charge, namely, energy efficiency is low in the hysteresis range. In the energy storage device having the hysteresis, when a less hysteresis range (first range) can be grasped, the high energy efficiency can be obtained by performing the charge-discharge within the range. For this reason, the energy storage device having the hysteresis can be applied to an application in which the high energy efficiency is required.

The less hysteresis range of the energy storage device having the hysteresis is a range where resistance is small and an input-output characteristic is excellent. When the less hysteresis range can be grasped, the energy storage device having the hysteresis can be applied to an application (for example, a power leveling application) in which the high input-output characteristic is required.

The management device may further include a first storage unit that stores the second range for each energization rate of the energy storage device. The determination unit specifies the second range corresponding to the energization rate stored in the first storage unit, and determines whether the change amount is included in the second range.

With the above configuration, the second range corresponding to the actual energization rate is specified based on the second range determined for each energization rate. The storage amount may be estimated using the specified second range. The management device may specify the second range when the second range associated with the actual energization rate is stored. When the second range associated with the actual energization rate is not stored, the management device may specify the second range corresponding to the actual energization rate by an interpolation method or the like based on the second range determined for each of a plurality of rates. Sometimes the second range varies depending on the energization rate of the energy storage device when the energy storage device is included in the first range, so that the inclusion of the energy storage device in the first range is correctly determined using the second range corresponding to the energization rate.

The management device may further include: a second storage unit that performs energization of the energy storage device at a predetermined rate, rests the energization every time the storage amount changes by a predetermined amount, acquires the change amount between the voltage of the energy storage device when the energization is rested and the voltage when the period elapses, and stores a change amount characteristic indicating a relationship between the storage amount or the voltage and the change amount; and a specification unit that specifies the second range based on the change amount characteristic. The first storage unit stores the specified second range.

With the above configuration, the energy storage device is energized at a predetermined rate, the change amount characteristic obtained by acquiring the change amount is stored every time the storage amount changes by the predetermined amount, and the second range is specified based on the change amount when the energy storage device is included in the first range. Based on the actual relationship between the storage amount or the voltage and the change amount, the second range is specified to correctly determine that the energy storage device is included in the first range.

The management device may further include an update unit that updates the first range according to degradation of the energy storage device. The specification unit updates the second range by specifying the second range corresponding to the first range updated by the update unit based on the change amount characteristic, the first storage unit stores the second range updated by the specification unit, and the estimation unit estimates the storage amount of the energy storage device based on the second range.

With the above configuration, the storage amount is estimated after the first range is updated according to the degradation of the energy storage device. Sometimes the first range changes according to the degradation of the energy storage device, so that the second range is more correctly specified using the first range corresponding to the degradation of the energy storage device when the energy storage device is included in the first range. The inclusion of the energy storage device in the first range is correctly determined using the second range more accurately specified.

The management device may estimate the storage amount of the energy storage device after the quick charge of the energy storage device.

According to another aspect of the present invention, an energy storage module includes: an energy storage device; and the management device described above.

In the above configuration, the less hysteresis range of the energy storage device and the storage amount can accurately be estimated.

According to still another aspect of the present invention, a management method includes: acquiring a change amount between voltage of an energy storage device when energization is rested from a state in which the energy storage device is energized and voltage when a period elapses; and determining whether the change amount is included in a second range corresponding to a first range where a difference in voltage between a storage amount-voltage characteristic during charge and a storage amount-voltage characteristic during discharge with respect to an identical storage amount is smaller than another range.

In the above configuration, when the change amount of the voltage is acquired and when the acquired change amount is included in the second range, the storage amount corresponding to the voltage may be estimated based on the storage amount-voltage characteristic of the first range. The case where the energy storage device is located within the first range is smaller than the case where the storage element is located out of the first range in the change amount, so that the case where the change amount is included in the second range can be estimated to be the state in which the energy storage device is included in the first range. That the energy storage device is located in a small hysteresis range can be detected in a short time based on the change amount in the resting state of the energy storage device. The storage amount-voltage characteristic is substantially uniquely determined in the state in which the energy storage device is included in the first range, so that the storage amount can be estimated using the storage amount-voltage characteristic.

According to yet another aspect of the present invention, a computer program that causes a computer to perform pieces of processing including: acquiring a change amount between voltage of an energy storage device when energization is rested from a state in which the energy storage device is energized and voltage when a period elapses; and determining whether the change amount is included in a second range corresponding to a first range where a difference in voltage between a storage amount-voltage characteristic during charge and a storage amount-voltage characteristic during discharge with respect to an identical storage amount is smaller than another range.

Hereinafter, the present invention will specifically be described based on the drawings illustrating the embodiment.

An electrode assembly of an energy storage device according to the embodiment contains an active material in which a storage amount-voltage characteristic has a hysteresis. In the embodiment, an example in which the voltage of the energy storage device is the CCV or the OCV while the storage amount is the SOC is mainly illustrated. A specific example of the storage amount-voltage characteristic is a correlation between the SOC and the OCV of the energy storage device indicated by the SOC-OCV curve. A $LiMeO2\text{-}Li_2MnO_3$ solid solution containing Ni as a Li-excess type can be cited as an example of the active material of the electrode of the energy storage device. Me represents a transition metal.

FIG. 1 is a graph illustrating an example of the SOC-OCV curve of the energy storage device. A horizontal axis indicates the SOC, and a vertical axis indicates the OCV. FIG. 1 illustrates a conceptual example of the SOC-OCV curve when the discharge is performed in the energy storage device and then the charge is performed. In the SOC-OCV curves illustrated by a solid line in FIG. 1, the lower SOC-OCV curve is the SOC-OCV curve during the discharge, and the upper SOC-OCV curve is the SOC-OCV curve during the charge. The SOC-OCV curve indicated by a broken line in FIG. 1 represents an average of the OCV during the discharge and the OCV during the charge with respect to the same SOC.

FIG. 1 illustrates an example of the SOC-OCV curve obtained under a predetermined charge-discharge condition within an OCV range where a difference between the OCV during the discharge and the OCV during the charge is small with respect to the same SOC. The hysteresis of the storage amount-voltage characteristic of the energy storage device is small as long as the charge-discharge of the energy storage device is performed only within the range of a specific OCV (SOC) as illustrated in FIG. 1. That is, the hysteresis of the storage amount-voltage characteristic is small when the charge-discharge is switched within the range of this OCV. Although omitted in FIG. 1, the difference between the OCV during the discharge and the OCV during the charge becomes larger with respect to the same SOC when the charge-discharge is switched out of the OCV range.

In the embodiment, the SOC-OCV range where the difference between the OCV during the discharge and the OCV during the charge decreases with respect to the same SOC is referred to as a first range (small difference range). Within the SOC range corresponding to the first range, the difference between the OCV during the discharge and the OCV during the charge with respect to the same SOC is smaller than the difference between the OCV during the discharge and the OCV during the charge with respect to the same SOC out of the SOC range. For example, the first range is a range where the OCV is greater than or equal to 3.6 V and less than or equal to 4.4 V, and the SOC range is a range where the SOC is greater than or equal to 40% and less than or equal to 95%. The first range is determined depending on the configuration of the energy storage device such as a composition of an electrode material. How much the difference between the OCV during the discharge and the OCV during the charge is considered to be small is determined by the setting.

When the inclusion of the OCV in the first range where the difference between OCV during the discharge and OCV during the charge decreases can be detected, the SOC can be estimated by the OCV method using the SOC-OCV curve in FIG. 1. Hereinafter, the charge and the discharge of the energy storage device are collectively referred to as energization. Unlike the OCV, the CCV read from the energy storage device during actual energization varies depending on an energization rate. For this reason, whether the OCV is included in the first range is hardly determined from the voltage read from the energy storage device during the actual energization.

In the embodiment, the energy storage device is energized, and an absolute value $\Delta OCV = |OCV_x - OCV_0|$ of a difference between a value $OCV_0$ of the voltage between both electrodes of the energy storage device immediately after the energization is rested and a value $OCV_x$ of the voltage between both electrodes after a predetermined period has elapsed since the resting of the energization is calculated, and the inclusion of the OCV in the first range is detected in a short time based on the $\Delta OCV$ (change amount).

Figure 2:
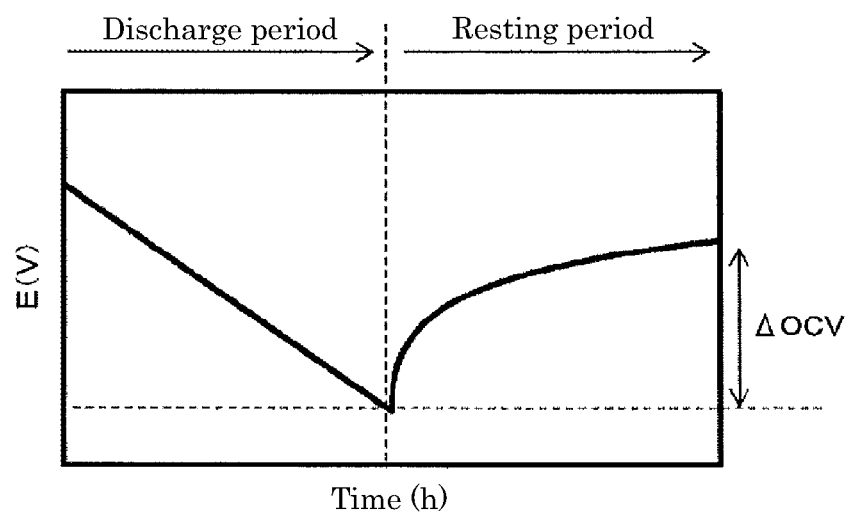
FIG. 2 is a graph illustrating a relationship between time and voltage during resting after discharge.

FIG. 2 is a graph illustrating a relationship between time and voltage during the resting after the discharge. The horizontal axis indicates the time (h), and the vertical axis indicates the voltage (V). The voltage decreases during a discharge period, and the voltage gradually rises and approaches the OCV during a resting period.

Figure 3:
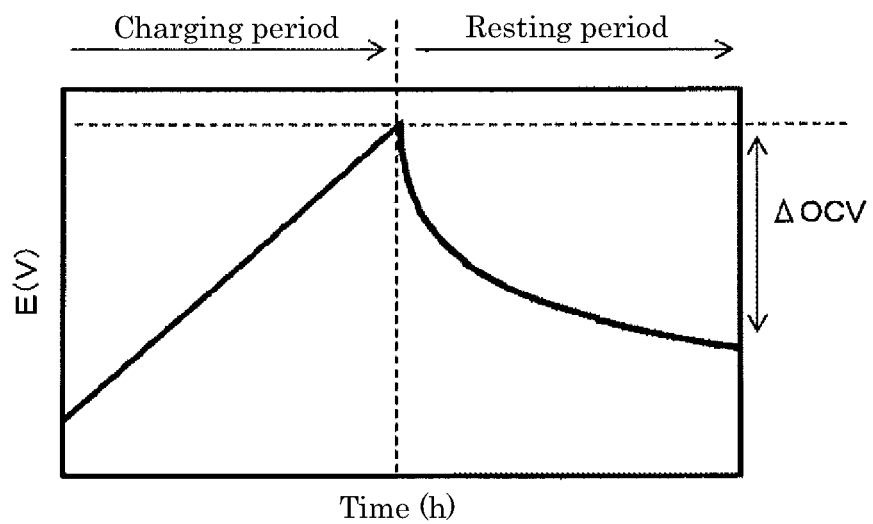
FIG. 3 is a graph illustrating the relationship between the time and the voltage during the resting after charge.

FIG. 3 is a graph illustrating the relationship between the time and the voltage during the resting after the charge. The horizontal axis indicates the time (h), and the vertical axis indicates the voltage (V). The voltage rises during a charge period, and the voltage gradually decreases and approaches the OCV during the resting period.

The $\Delta OCV$ may be expressed as a positive value for the discharge and as a negative value for the charge instead of the absolute value, and a second range (to be described later) may be set.

Figure 4:
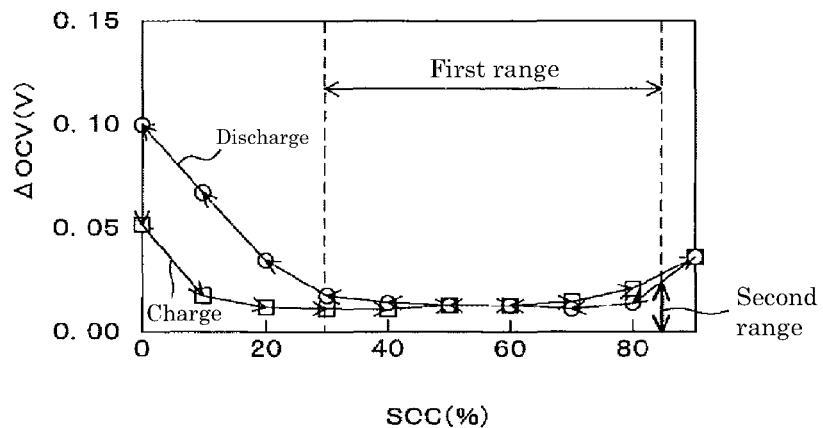
FIG. 4 is a graph illustrating an example of a change in ΔOCV when the energy storage device is energized at a constant rate.
Figure 4:
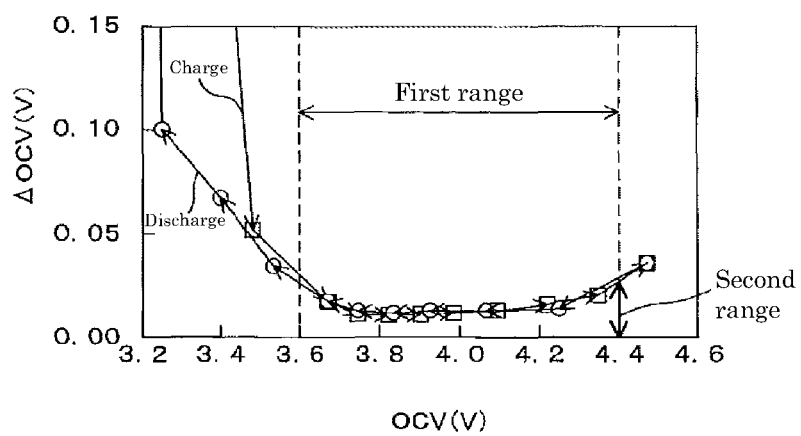

FIG. 4 is a graph illustrating an example of a change in $\Delta OCV$ when the energy storage device is energized at a constant rate. FIG. 4A illustrates an example of a relationship between the SOC and the $\Delta OCV$ after the resting of the energization when the energy storage device is energized at a constant rate. FIG. 4B is a graph illustrating an example of a relationship between the OCV and the $\Delta OCV$ after a constant time elapses when the energy storage device is energized at a constant rate. A unit of the OCV is V. Intermittent charge-discharge is performed in the energy storage device in which a LiMeO2-Li2MnO3 solid solution containing Ni as the active material of the positive electrode is used. In the intermittent charge-discharge, a resting period for three hours is provided after the charge is performed by 10% at a rate of 0.1 CmA from the state of SOC=0% to the state of SOC=100%, and a resting period for three hours is provided after the discharge is performed by 10% at a rate of 0.1 CmA from the state of SOC=100% to the state of SOC=0%. FIG. 4A illustrates the $\Delta OCV$. The energization is performed up to each SOC, the energization was rested for 10 minutes, and the $\Delta OCV$ is calculated from the value $OCV_0$ between both the electrodes of the energy storage device immediately after the resting of the energization and the value $OCV_x$ of the voltage between both the electrodes after ten minutes of the resting of the energization. FIG. 4B illustrates the relationship between the OCV and the $\Delta OCV$ after the energization is rested for three hours.

FIG. 4A illustrates the SOC range associated with the first range where the difference between the OCV during the discharge and the OCV during the charge becomes small with respect to the same SOC. FIG. 4B illustrates the OCV range associated with the first range. When the charge and the discharge are performed, the value of $\Delta OCV$ is smaller in the case where the OCV is located within the first range than in the case where the OCV is located out of the first range. This tendency is similar to the case where the resting period obtaining the $\Delta OCV$ is shorter than ten minutes. For this reason, whether the OCV is included in the first range can be determined based on the $\Delta OCV$. The time required for the determination is substantially the same as the energization resting period required to obtain the $\Delta OCV$. The energization resting period required to obtain the $\Delta OCV$ is shorter than the energization resting period required to actually measure the OCV. For example, the energization resting period required to obtain the $\Delta OCV$ is ten minutes or less, and the energization resting period required to actually measure the OCV is three hours. That is, whether the OCV is included in the first range can be determined in time shorter than the time required to actually measure the OCV.

In the embodiment, the range (variation range) of the $\Delta OCV$ obtained when the OCV is included in the first range is referred to as the second range. For example, the second range is a range where the $\Delta OCV$ is less than or equal to 0.02. Because the voltage change is small when the $\Delta OCV$ is included in the second range, the value $OCV_x$ of the voltage between both electrodes of the energy storage device after a predetermined period elapses since the resting of the energization becomes a value close to the OCV, and the OCV method can be adopted while the $OCV_x$ is regarded as the OCV. Thus, when the $\Delta OCV$ included in the second range is obtained after the use of the energy storage device, the SOC can be estimated by the OCV method using the SOC-OCV curve in FIG. 1.

Figure 5:
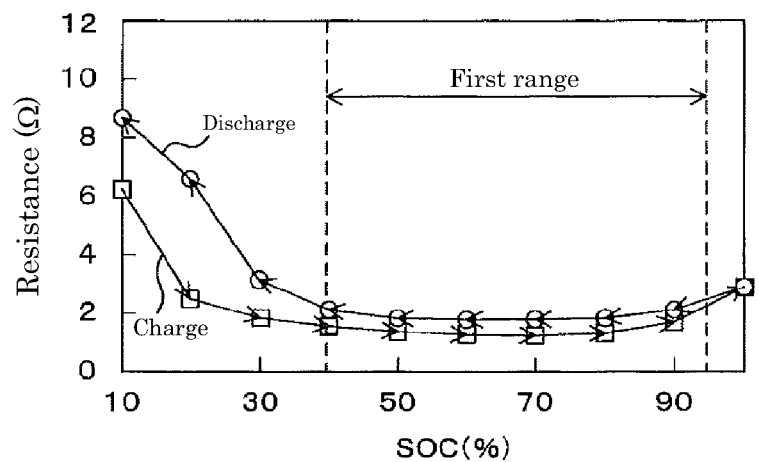
FIG. 5 is a graph illustrating a relationship between SOC and resistance when a 0.1-Hz resistance is detected for each SOC by an AC impedance measurement method.

FIG. 5 is a graph illustrating a relationship between the SOC and resistance when a 0.1-Hz resistance is detected for each SOC by an AC impedance measurement method. The horizontal axis indicates the SOC (%), and the vertical axis indicates the resistance (a).

Figure 6:
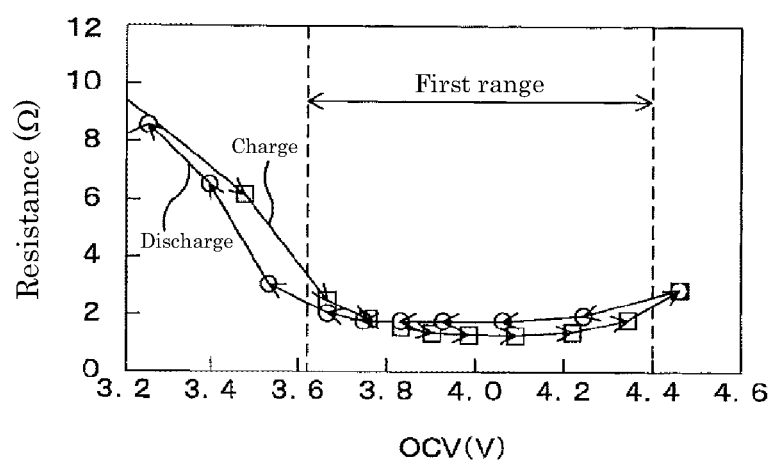
FIG. 6 is a graph illustrating a relationship between OCV and the resistance when the 0.1-Hz resistance is detected for each OCV by the AC impedance measurement method.

FIG. 6 is a graph illustrating a relationship between the OCV and the resistance when the 0.1-Hz resistance is detected for each OCV by the AC impedance measurement method. The horizontal axis indicates the OCV (V), and the vertical axis indicates the resistance (a).

As can be seen from FIGS. 5 and 6, the case where the SOC and the OCV are located within the first range is lower than the case where the SOC and the OCV are located out of the first range in the resistance.

When the charge-discharge is performed in a situation in which the SOC and the OCV are located out of the first range, a large polarization is generated due to a reaction based on the active material in which the SOC-OCV exhibits the hysteresis, and the resistance increases. For this reason, the ΔOCV increases.

Figure 7:
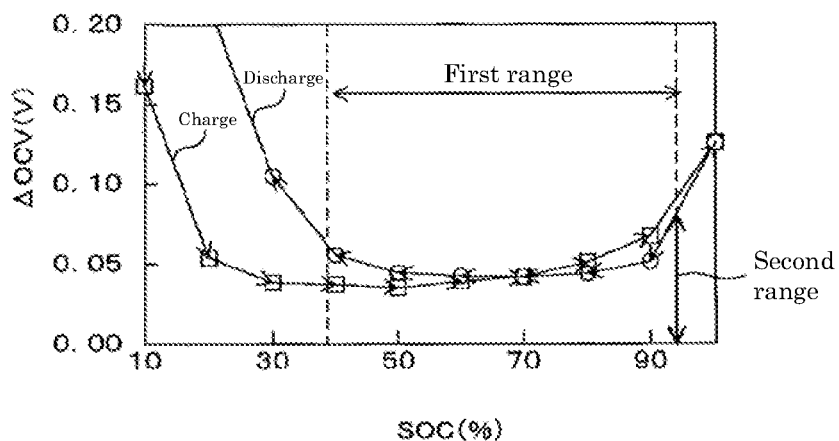
FIG. 7 is a graph illustrating an example of the change in ΔOCV when the energy storage device is energized at a rate different from that in FIG. 4.
Figure 7:
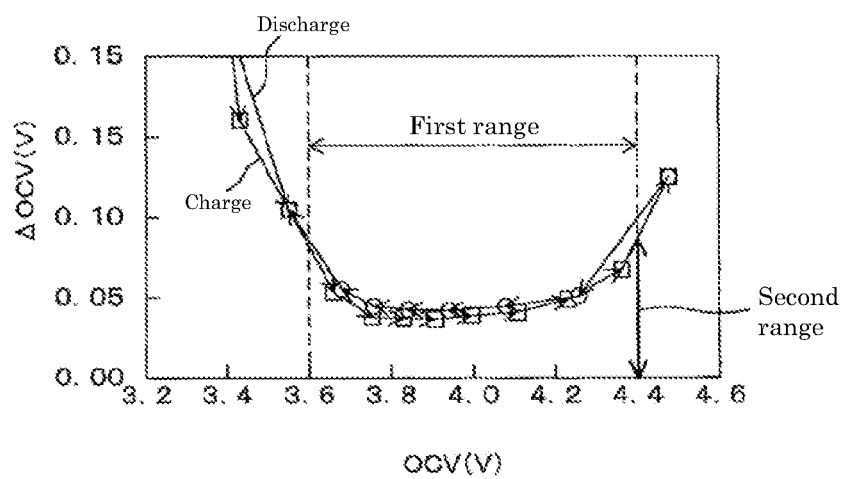

FIG. 7 is a graph illustrating an example of the change in ΔOCV when the energy storage device is energized at a rate different from that in FIG. 4. FIG. 7A illustrates an example of the relationship between the SOC and the ΔOCV after the resting of the energization when the energy storage device is energized at the rate. FIG. 7B illustrates an example of the relationship between the OCV and the ΔOCV after a constant time elapses when the energy storage device is energized at the rate. FIG. 7A illustrates the relationship between the SOC and the ΔOCV when the charge-discharge rate is set to 0.5 CmA, and FIG. 7B illustrates the relationship between the SOC and the ΔOCV after the energization is rested for three hours when the charge-discharge rate is set to 0.5 CmA. As illustrated in FIGS. 7A and B, even if the energization rate increases, during both the charge and the discharge, the value of ΔOCV in the case where the OCV and the SOC are included in the first range is smaller than the value of ΔOCV in the case where the OCV and the SOC are other values. This tendency is similar to the case where the resting period obtaining the ΔOCV is shorter than ten minutes. Thus, whether the OCV is included in the first range can be determined based on the ΔOCV even if the energization rate varies. However, as illustrated in FIGS. 7A and 7B, sometimes the ΔOCV obtained in the case where the OCV is included in the first range changes when the energization rate changes. In the example of FIG. 7A, the second range corresponding to the first range is a range where the ΔOCV is less than or equal to 0.07.

Figure 8:
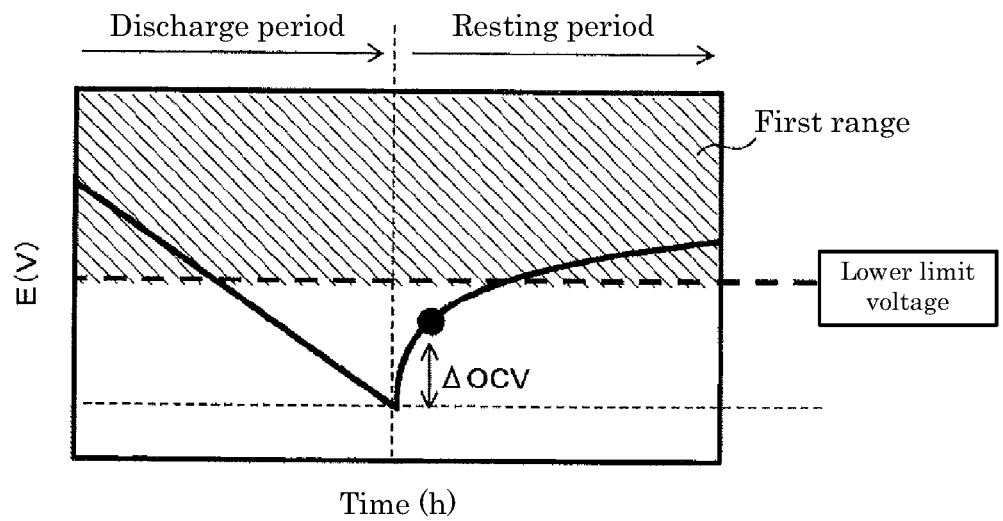
FIG. 8 is a graph illustrating the relationship between the time and the voltage during the resting after the discharge is performed at a high rate.

FIG. 8 is a graph illustrating an example of the relationship between the time and the voltage during the resting after the discharge is performed at a high rate. The horizontal axis indicates the time (h), and the vertical axis indicates the voltage (V). A lower limit voltage in FIG. 8 is a lower limit voltage of the first range.

Although the voltage during the resting is lower than the lower limit voltage, the voltage gradually rises during the resting period, and the OCV becomes higher than the lower limit voltage and falls within the first range.

When the ΔOCV falls within the second range in s predetermined resting period, namely, when the ΔOCV is less than or equal to a predetermined value, the SOC can be estimated based on the SOC-OCV of the first range without waiting for the OCV to rise until the OCV to fall within the first range.

When the ΔOCV is located out of the second range, namely, when the ΔOCV is greater than or equal to a predetermined value, the OCV becomes stable at a voltage lower than the lower limit voltage, and it is possible to estimate that the OCV does not fall within the first range.

That is, in the case where the OCV becomes lower than the lower limit voltage due to the discharge at a high rate and the like, when the OCV is estimated to be higher than the lower limit voltage after the a predetermined resting period elapses, the SOC can be estimated instead of (or in conjunction with) the current integration method. The same applies to the case where the charge at a high rate, such as quick charge of the vehicle.

The management method of the present embodiment is not limited to the case where the energization is performed at high rate. In the management method of the present embodiment, even if the energy storage device during the resting is lower than the lower limit value of the first range, whether the OCV falls within the first range can be determined well in a short time, and the SOC can be estimated well.

Figure 9:
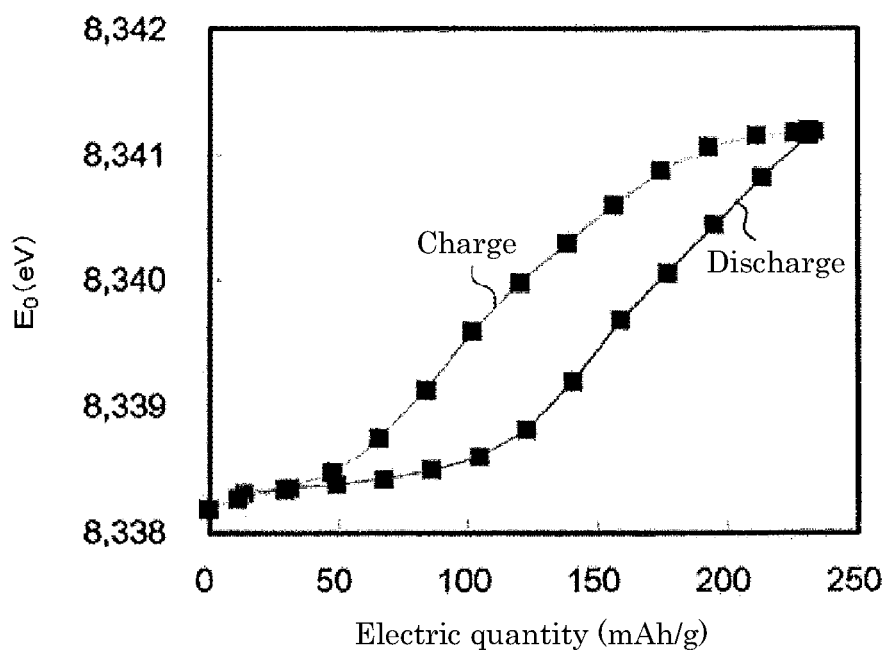
FIG. 9 is a graph illustrating transition of K absorption edge energy of Ni in a Li-excess active material calculated by X-ray absorption spectroscopy (XAFS measurement) with respect to an electric quantity.

FIG. 9 is a graph illustrating transition of K absorption edge energy of Ni in a Li-excess active material calculated by X-ray absorption spectroscopy (XAFS measurement) with respect to an electric quantity. The horizontal axis indicates the electric quantity stored in the energy storage device, and the unit is mAh/g. The vertical axis indicates the K absorption edge energy $E0$ of Ni, and the unit is eV. The K absorption edge energy of Ni hardly changes in the region near full charge during the charge and in the region near full discharge during the discharge. In the regions, it is considered that the hysteresis of the storage amount-voltage characteristic is generated because an oxidation-reduction reaction other than Ni such as an oxidation-reduction reaction in which oxygen is involved is generated. The increase in polarization is caused by this oxidation-reduction reaction. In the regions, because a reaction having a large time constant is generated, the change in CCV increases due to the increase in polarization during the energization, and the initial ΔOCV in the resting period after the energization is considered to be large. Thus, when the charge is not performed from a base potential to a potential nobler than the reached potential and when the discharge is not performed to a base potential lower than a predetermined potential, the oxidation-reduction reaction of Ni is mainly generated, so that the hysteresis is considered to be smaller. In the region where the hysteresis becomes small, because a reaction having a small time constant is generated, the polarization during the energization is small and the change in CCV is also small, and the initial ΔOCV in the resting period after the energization is considered to be small.

The user often repeats the charge-discharge while the SOC falls within the first range.

In recent years, there is a demand for the charge such that the SOC reaches about 80% in a short time (about 10 to 15 minutes) by the quick charge.

The management device and the management method of the embodiment can be applied after the user normally uses the energy storage device. Without waiting for the OCV to be stabilized when the use of the storage element is rested, whether the energy storage device is located within the first range in a short time can be determined by the ΔOCV, and the SOC can be estimated from the voltage acquired during the resting. The voltage is not limited to the $OCV_x$. When the rate is low, CCV ($OCV_0$) during the resting can also be used. The OCV obtained by converting the CCV based on a predetermined conversion expression can also be used.

The SOC can be estimated without performing the resting for a long time, so that the SOC can be estimated in a short time after, for example, the quick charge. During the use of the energy storage device, the SOC can be acquired after a short resting.

First Embodiment

Figure 10:
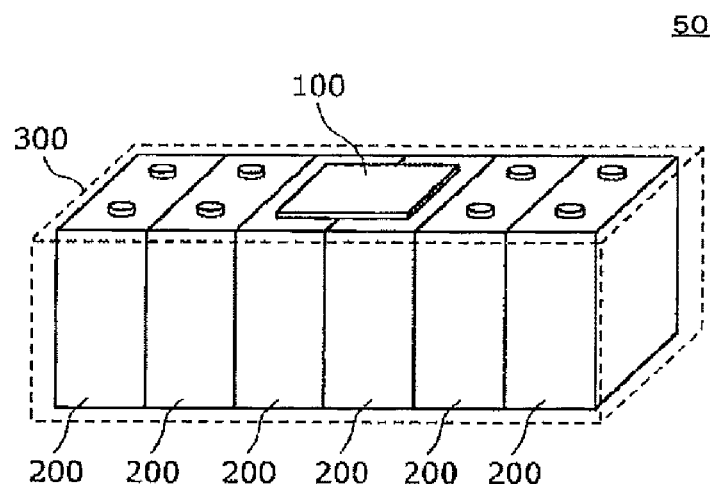
FIG. 10 is a schematic diagram illustrating an example of an energy storage module.

A first embodiment will be described below by taking an energy storage module mounted on a vehicle as an example. FIG. 10 is a schematic diagram illustrating an example of the energy storage module. An energy storage module 50 includes a plurality of energy storage devices 200, a management device 100, and a case 300 that stores the plurality of energy storage devices 200 and the management device 100. The energy storage module 50 may be used as a power source for an electric vehicle (EV) or a plug-in hybrid electric vehicle (PHEV). The energy storage device 200 is not limited to a prismatic cell, but may be a cylindrical cell or a pouch cell.

The monitoring device 100 may be a circuit board disposed opposite to the plurality of energy storage devices 200. The monitoring device 100 monitors a state of the energy storage device 200. The monitoring device 100 may be the management device. Alternatively, a computer (not illustrated) connected to the monitoring device 100 in a wired or wireless manner may perform a management method based on information output from the monitoring device 100.

Figure 11:
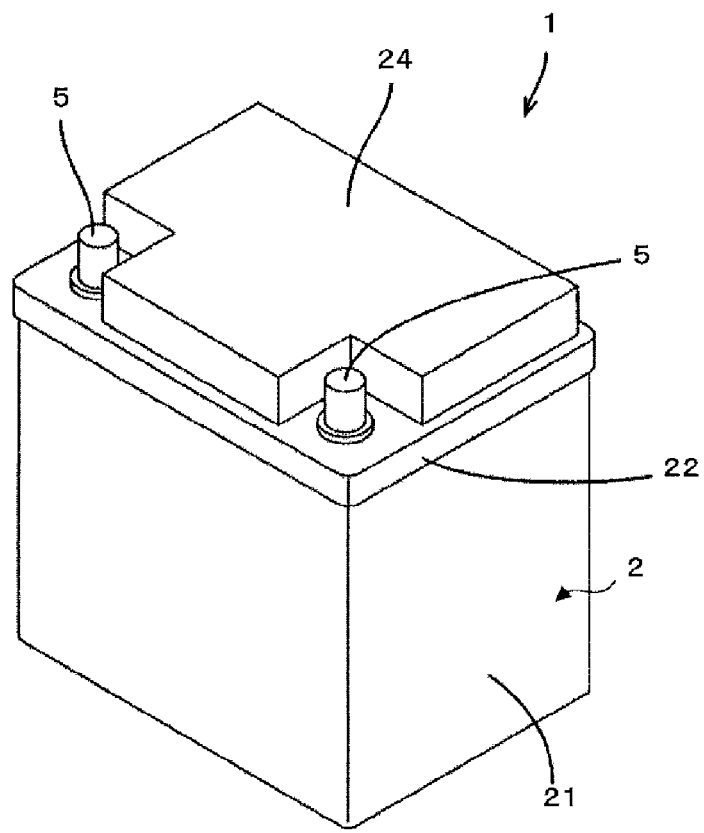
FIG. 11 is a schematic diagram illustrating another example of the energy storage module.
Figure 12:
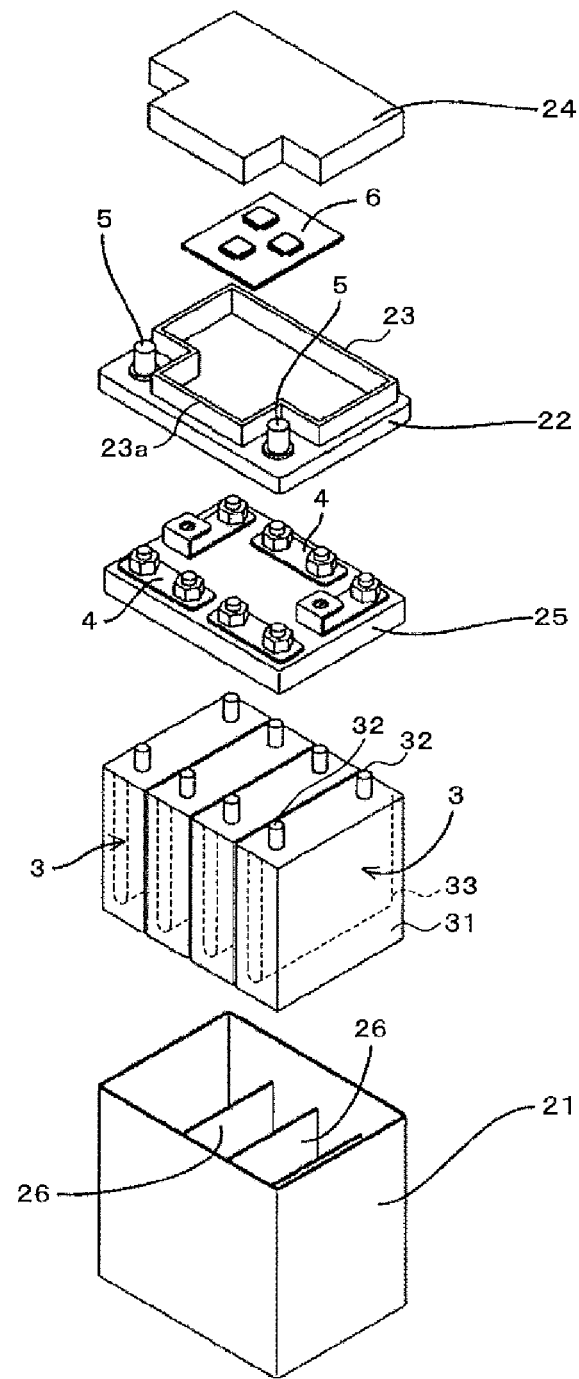
FIG. 12 is an exploded perspective view illustrating a battery module.
Figure 13:
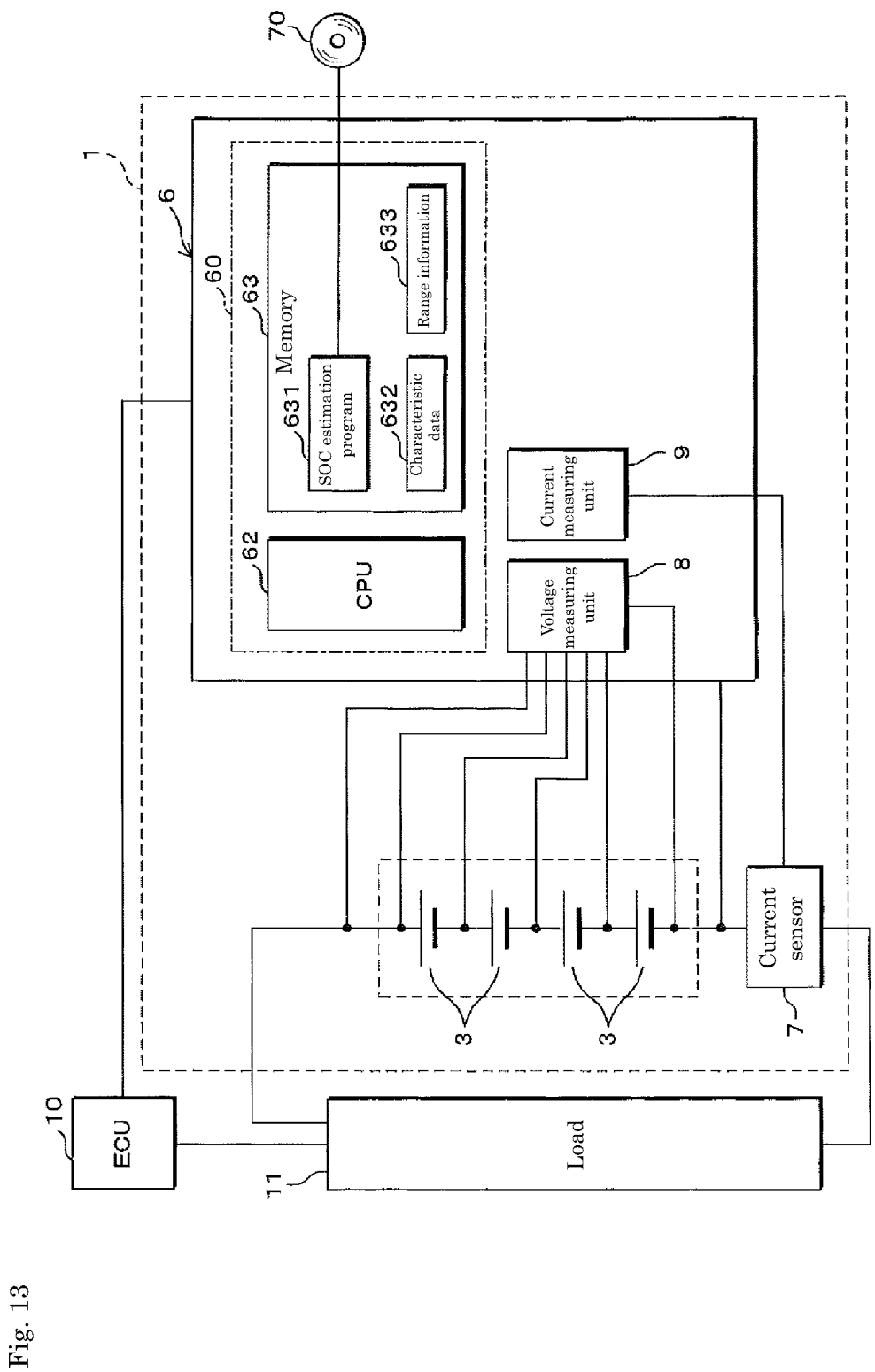
FIG. 13 is a block diagram illustrating a battery module according to a first embodiment.

FIG. 11 is a schematic diagram illustrating another example of the energy storage module. The energy storage module (hereinafter, referred to as a battery module) 1 may be a 12-volt power supply or a 48-volt power supply that is suitably mounted on an engine vehicle. FIG. 11 is a schematic perspective view of the battery module 1 for a 12-V power supply. FIG. 12 is an exploded perspective view of the battery module 1, and FIG. 13 is a block diagram of the battery module 1 of the first embodiment.

The battery module 1 includes a rectangular parallelepiped case 2. A plurality of lithium ion secondary batteries (hereinafter referred to as a battery) 3, a plurality of bus bars 4, a battery management unit (BMU) 6, and a current sensor 7 are accommodated in the case 2. The battery 3 includes a rectangular parallelepiped case 31 and a pair of terminals 32, 32 that is provided on one side surface of the case 31 and having different polarities. The case 31 houses an electrode assembly 33 in which a positive electrode plate, a separator, and a negative electrode plate are laminated. The battery 3 corresponds to the energy storage device.

At least one of a positive active material included in the positive electrode plate and a negative active material included in the negative electrode plate of the electrode assembly 33 generates at least two electrochemical reactions depending on a transition of charge-discharge. As illustrated in FIG. 1, the storage amount-voltage characteristic of the battery 3 has a smaller hysteresis under a predetermined charge-discharge condition. That is, the battery 3 has the first range that is the OCV range where the difference between the OCV during the discharge and the OCV during the charge with respect to the same SOC decreases under a predetermined charge-discharge condition. The hysteresis of the storage amount-voltage characteristic is small when the charge-discharge is switched within the range where the OCV is included in the first range.

Examples of the positive active material include Li-excess active materials, such as $LiMeO_2$—$Li_2MnO_3$ solid solution, a $Li_2O$—$LiMeO_2$ solid solution, a $Li_3NbO_4$—$LiMeO_2$ solid solution, a $Li_4WO_5$—$LiMeO_2$ solid solution, a $Li_4TeO_5$—$LiMeO_2$ solid solution, a $Li_3SbO_4$—$LiFeO_2$ solid solution, a $Li_2RuO_3$—$LiMeO_2$ solid solution, and a $Li_2RuO_3$—$Li_2MeO_3$ solid solution, which are the $Li_2MnO_3$-based active material. Examples of the negative active materials include hard carbon, metals such as Si, Sn, Cd, Zn, Al, Bi, Pb, Ge, and Ag or alloys thereof, or chalcogenides containing these. SiO can be cited as an example of the chalcogenide. The technique of the present invention is applicable to the case where at least one of the positive active materials and negative active materials has the hysteresis.

The case 2 is made of a synthetic resin. The case 2 includes a main body 21, a lid 22 that closes an opening of the main body 21, a BMU housing 23 provided on an outer surface of the lid 22, a cover 24 covering the BMU housing 23, an inner lid 25, and a partition plate 26. The inner lid 25 and the partition plate 26 may not be provided. The battery 3 is inserted between the partition plates 26 of the main body 21. A plurality of bus bars 4 made of a metal are placed on the inner lid 25. The inner lid 25 is disposed on a terminal surface on which the terminal 32 of the battery 3 is provided, the adjacent terminals 32 of the adjacent batteries 3 are connected to each other by the bus bar 4, and the batteries 3 are connected in series.

The BMU housing 23 has a box shape, and includes a protrusion 23a protruding outward in a prismatic shape in a central portion of one long side surface. A pair of external terminals 5, 5 that are made of metal such as a lead alloy and has different polarities is provided on both sides of the protrusion 23a in the lid 22. The BMU 6 is configured by mounting an information processor 60, a voltage measuring unit 8, and a current measuring unit 9 on a substrate. The BMU 6 is housed in the BMU housing 23 and the BMU housing 23 is covered with the cover 24, whereby the battery 3 and the BMU 6 are connected to each other. The BMU 6 or the information processor 60 corresponds to the management device. The information processor 60 corresponds to the computer.

As illustrated in FIG. 13, the information processor 60 includes a central processing unit (CPU) 62 and a memory 63. The memory 63 is a nonvolatile memory. The memory 63 stores various programs including an SOC estimation program (hereinafter referred to as a program) 631 of the first embodiment. The CPU 62 performs the SOC estimation processing according to the program 631 read from the memory 63 or according to the program 631 stored in the memory 63. The program 631 is provided while stored in a computer-readable recording medium 70 such as a CD-ROM, DVD-ROM, and USB memory, and is stored in the memory 63 by installing the program in the BMU 6. Alternatively, the program 631 may be acquired from an external computer (not illustrated) connected to a communication network, and stored in the memory 63.

The memory 63 stores characteristic data 632 indicating the storage amount-voltage characteristic in the case where the OCV is included in the first range where the difference between the OCV during the discharge and the OCV during the charge decreases. The first range is determined by the configuration of the battery 3. For example, the characteristic data 632 indicates an average SOC-OCV curve during the charge and the discharge as illustrated in FIG. 1. The characteristic data 632 is acquired by actually measuring the storage amount-voltage characteristic. The characteristic data 632 may be data that is not updated, or may be updated as appropriate by actual measurement. For example, each time the battery 3 is used, the storage amount-voltage characteristic may be measured, and the characteristic data 632 may be updated. Alternatively, the characteristic data 632 may be the SOC-OCV curve during the charge and the SOC-OCV curve during the discharge. The SOC-OCV may be stored in the memory 63 as a function expression.

The memory 63 stores range information 633 indicating a second range that is a range of the $\Delta OCV$ obtained when the OCV is included in the first range. The second range is acquired by actually measuring the relationship between the SOC or the OCV and the $\Delta OCV$ as illustrated in FIGS. 4 and 7, and by obtaining the range of the $\Delta OCV$ when the OCV is included in the first range. The range information 633 may indicate the upper limit of the second range, and indicate the upper limit and the lower limit of the second range. The memory 63 corresponds to the first storage unit.

The voltage measuring unit 8 is connected to both ends of the battery 3 via a voltage detection line, and measures the voltage at each battery 3 at predetermined time intervals.

The current measuring unit 9 measures the current passed through the battery 3 via the current sensor 7 at predetermined time intervals. The external terminals 5, 5 of the battery module 1 are connected to a starter motor that starts the engine and a load 11 such as an electric component. An electronic control unit (ECU) 10 is connected to the BMU 6 and the load 11.

A storage amount estimation method for determining whether the ΔOCV is included in the second range and estimating the storage amount when the ΔOCV is included in the second range will be described as a management method of the first embodiment.

Figure 14:
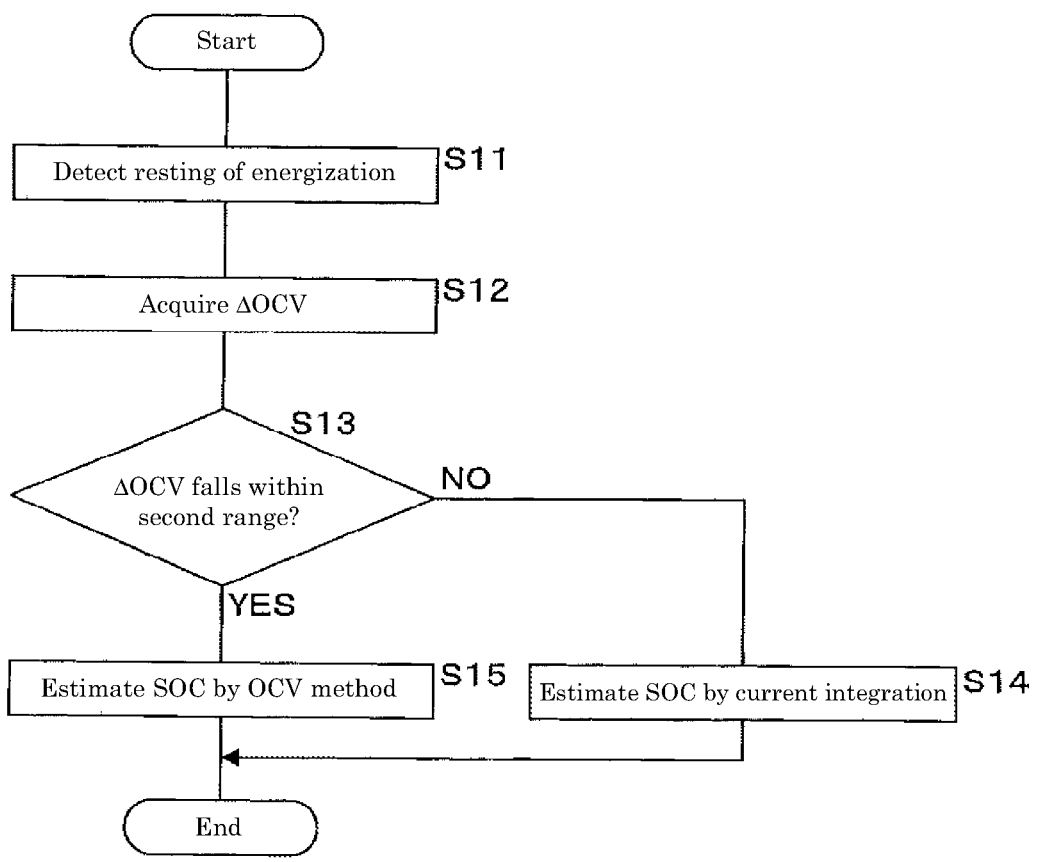
FIG. 14 is a flowchart illustrating a procedure of processing of storage amount estimation processing performed by an information processor of the first embodiment.

FIG. 14 is a flowchart illustrating a procedure of processing of storage amount estimation processing performed by the information processor 60 of the first embodiment. The CPU 62 performs the following processing according to the program 631.

The CPU 62 detects that the energization of the battery 3 is rested during the operation of the battery 3 (S11). In S11, for example, the CPU 62 detects that the energization of the battery 3 is rested based on a measurement result of the current measuring unit 9. When the energization of the battery 3 is rested under the control of the ECU 10, the CPU 62 may be notified by the ECU 10 that the energization of the battery 3 is rested. The CPU 62 may rest the energization of the battery 3 and detect the resting of the energization by controlling the operation of the battery 3 through the ECU 10.

Subsequently, the CPU 62 acquires the ΔOCV (S12). In S12, the CPU 62 acquires the value $OCV_0$ of the voltage between both the electrodes of the battery 3 immediately after the resting of the energization based on measurement results of the voltage measuring unit 8 and the current measuring unit 9, and or acquires the value $OCV_x$ of the voltage between both the electrodes of the battery 3 when a predetermined period elapses while the resting of the energization is continued for one minute or ten minutes. The CPU 62 calculates $\Delta OCV=|OCV_x-OCV_0|$. The processing in S12 corresponds to the acquisition unit.

The CPU 62 determines whether the acquired ΔOCV is included in the second range indicated by the range information 633 (S13). The processing in S13 corresponds to the determination unit. When the ΔOCV is not included in the second range (NO in S13), the CPU 62 estimates the SOC of the battery 3 by current integration (S14), and ends the processing. The CPU 62 performs the SOC estimation method in the case of detecting that the OCV of the battery 3 is not included in the first range in response to the fact that the ΔOCV is not included in the second range in S13 and the case where the OCV is not included in the first range in S14.

When the ΔOCV is included in the second range (YES in S13), the CPU 62 estimates the SOC of the battery 3 by the OCV method (S15). The CPU 62 performs the SOC estimation method in the case of detecting that the OCV of the battery 3 is included in the first range in response to the fact that the ΔOCV is included in the second range in S13 and the case where the OCV is included in the first range in S15. In S15, the CPU 62 regards the $OCV_x$ as the OCV, and estimates the SOC corresponding to the OCV based on the storage amount-voltage characteristic indicated by the characteristic data 632. For example, the CPU 62 estimates the SOC by reading the value of the SOC corresponding to the OCV on the average SOC-OCV curve during the charge and the discharge as illustrated in FIG. 1. The processing in S15 corresponds to the estimation unit. After the processing in S15 ends, the CPU 62 ends the storage amount estimation processing. The CPU 62 may perform the processing in S14 when the value of the SOC corresponding to the first range cannot be estimated in S15. For example, the CPU 62 may perform the processing in S14 when the value of the SOC corresponding to the OCV does not exist on the SOC-OCV curve. The CPU 62 may perform the processing in S14 when the value of the SOC estimated by the processing in S15 is not included in the SOC range corresponding to the first range. A part or all of the pieces of processing in S11 to S15 may be performed by hardware.

As described above in detail, the information processor 60 acquires the ΔOCV after the energization of the battery 3 is rested, and estimates the SOC of the battery 3 by the OCV method when the ΔOCV is included in the second range. The case where the OCV is included in the first range is smaller than the case where the OCV is another value in the value of the ΔOCV, so that the state in which the OCV is included in the first range can be estimated when the ΔOCV is included in the second range while the OCV is included in the first range. That is, it is possible to determine that the OCV is located in the range where the hysteresis decreases. In the state in which the OCV is included in the first range, namely, in the state in which the OCV is located in the range where the hysteresis decreases, the difference between the OCV during the discharge and the OCV during the charge with respect to the same SOC is small, and the SOC-OCV curve is substantially uniquely determined. Because the voltage change is small in the state in which the OCV is located in the range where the hysteresis decreases, the value $OCV_x$ of the voltage between both the electrodes of the battery 3 after the predetermined period elapses since the resting of the energization becomes a value close to the OCV, and the OCV method can be performed while the OCVx is regarded as the OCV. For this reason, the SOC of the battery 3 can be estimated by the OCV method. The information processor 60 can estimate the storage amount from the SOC-OCV curve, so that the amount of energy, such as electric energy, which is currently stored in the battery 3 can be estimated as well as the SOC as the storage amount.

Thus, the management device can accurately estimate the storage amount of the battery 3 having the hysteresis of the storage amount-voltage characteristic. Even if the battery 3 uses an electrode material in which the hysteresis of the storage amount-voltage characteristic is generated in order to achieve the high capacity, the management device can accurately estimate the storage amount. That is, the management device can accurately estimate the storage amount of the battery 3 having a high capacity. The battery module 1 can efficiently control the charge and the discharge of the battery 3 based on the accurately-estimated storage amount.

Second Embodiment

Figure 15:
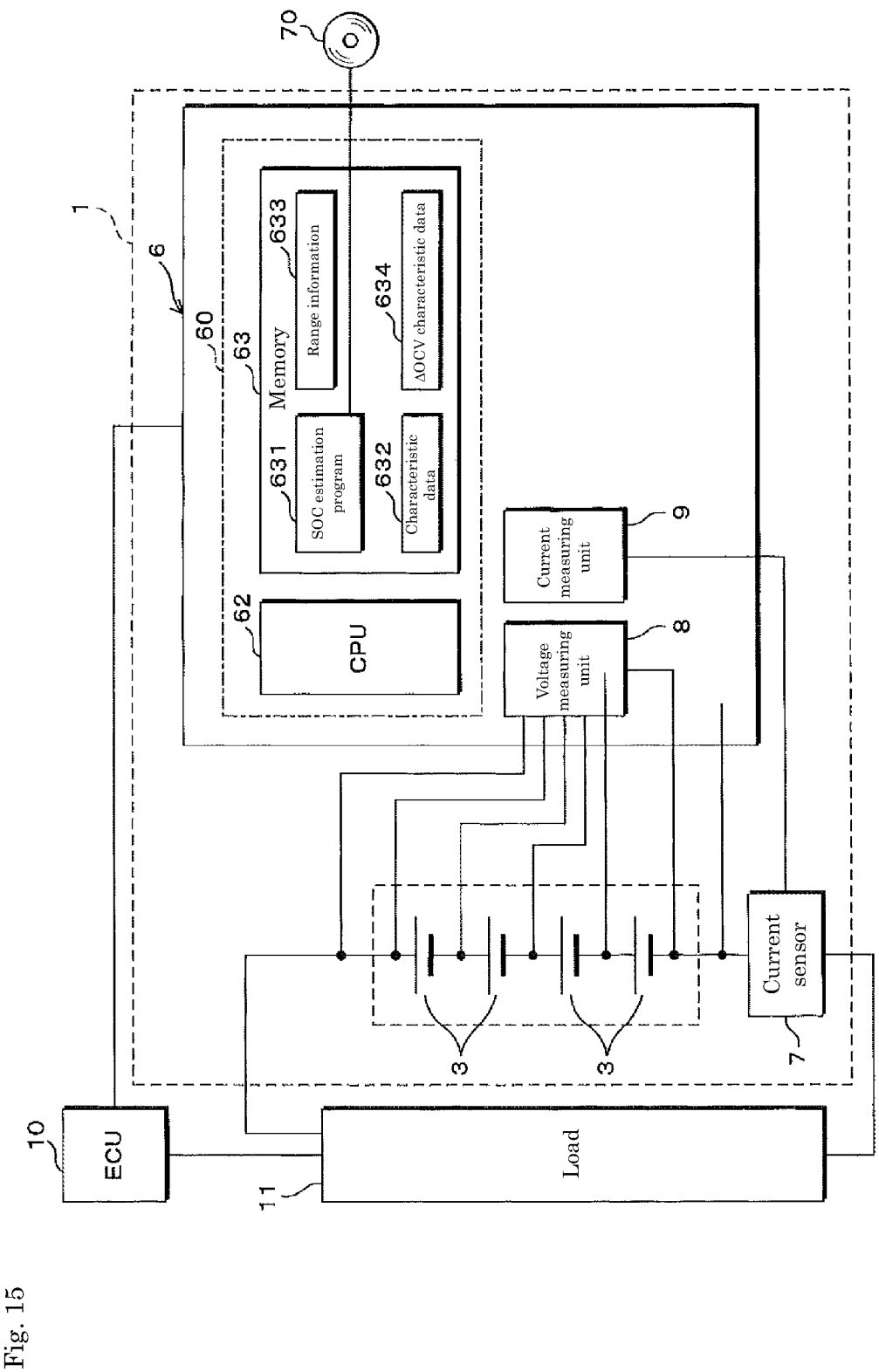
FIG. 15 is a block diagram illustrating a battery module according to a second embodiment.

A second embodiment illustrates a mode in which the second range is specified when the OCV is included in the first range where the difference between the OCV during the discharge and the OCV during the charge decreases based on the relationship between the SOC and the ΔOCV. FIG. 15 is a block diagram illustrating the battery module 1 of the second embodiment. As illustrated in FIG. 4A or FIG. 4B, the memory 63 stores ΔOCV characteristic data (hereinafter, referred to as characteristic data) 634 in which a ΔOCV characteristic (variation characteristic) indicating the relationship between the SOC or the OCV and the ΔOCV when the battery 3 is energized at a constant rate is recorded. The memory 63 corresponds to the first storage unit and the second storage unit. Other configurations of the battery module 1 are the same as those of the first embodiment.

Figure 16:
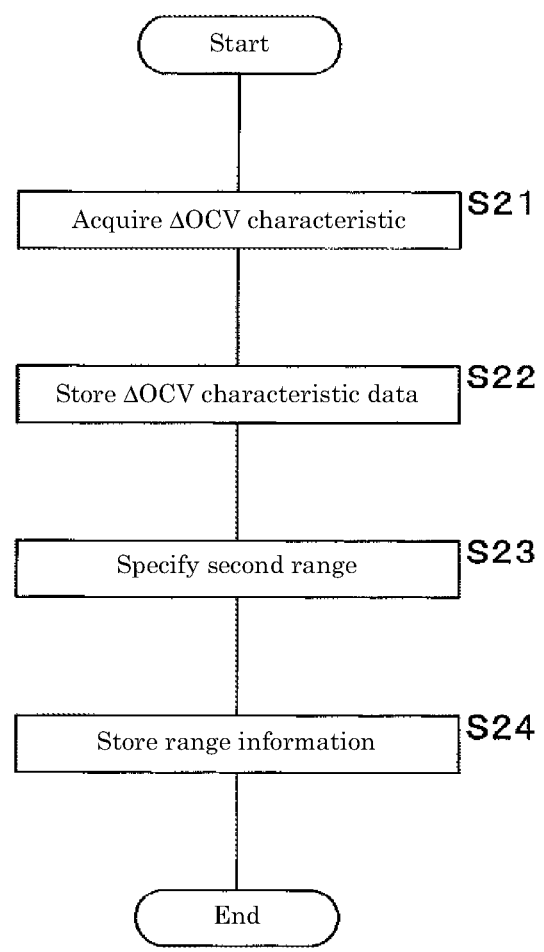
FIG. 16 is a flowchart illustrating a procedure of second range specifying processing performed by an information processor of the second embodiment.

FIG. 16 is a flowchart illustrating a procedure of second range specifying processing performed by the information processor 60 of the second embodiment. The CPU 62 performs the following processing according to the program 631.

The CPU 62 acquires the ΔOCV characteristic that is the relationship between the SOC or the OCV and the ΔOCV when the battery 3 is energized at a constant rate (S21). In S21, the CPU 62 energizes the battery 3 at a constant rate, and obtains the ΔOCV corresponding to each of the SOC during the charge and the SOC during the discharge, thereby obtaining the ΔOCV characteristic indicating the relationship between the SOC and the ΔOCV as illustrated in FIG. 4A. Alternatively, the CPU 62 energizes the battery 3 at a constant rate, and obtains the ΔOCV corresponding to each of the SOC during the charge and the SOC during the discharge after a predetermined time elapses since the energization is rested, thereby obtaining the ΔOCV characteristic indicating the relationship between the OCV and the ΔOCV as illustrated in FIG. 4B.

The CPU 62 stores characteristic data 634 in which the acquired ΔOCV characteristic is recorded in the memory 63 (S22). For example, the pieces of processing in S21 and S22 are performed when the battery module 1 is manufactured or connected to the load 11. The CPU 62 downloads the previously-produced characteristic data 634 from the outside, and the memory 63 stores the characteristic data 634, whereby the pieces of processing in S21 and S22 may be performed.

Subsequently, based on the characteristic data 634 stored in the memory 63, the CPU 62 specifies the second range when the OCV is included in the first range (S23). In S23, the CPU 62 acquires the ΔOCV corresponding to the OCV included in the predetermined first range or the ΔOCV corresponding to the SOC included in the first range from the ΔOCV characteristic, and specifies the range of the acquired ΔOCV. The processing in S23 corresponds to the specification unit.

The CPU 62 stores the range information 633 indicating the specified second range in the memory 63 (S24), and ends the processing. The information processor 60 may perform the pieces of processing in S21 to S24 only once. The information processor 60 appropriately updates the characteristic data 634 in which the ΔOCV characteristic is recorded and the range information 633 indicating the second range by repeating the pieces of processing in S21 to S24 at appropriate timing such as the case where a certain period elapses.

Similarly to the first embodiment, the information processor 60 performs the storage amount estimation processing in S11 to S15. Consequently, also in the second embodiment, the information processor 60 estimates the SOC of the battery 3 by the OCV method in the case where the ΔOCV is included in the second range while the OCV is included in the first range where the difference between the OCV during the discharge and the OCV during the charge decreases. The CPU 62 may perform the pieces of processing in S23 and S24 immediately before the processing in S13.

Also in the second embodiment, the information processor 60 estimates the SOC of the battery 3 by the OCV method in the case where the ΔOCV is included in the second range while the OCV is included in the first range. Thus, the management device can accurately estimate the storage amount of the battery 3 having the hysteresis of the storage amount-voltage characteristic.

The information processor 60 specifies the second range based on the acquired ΔOCV characteristic when the OCV is included in the first range. Because the second range is specified based on the actual relationship between the SOC or the OCV and the ΔOCV, the second range is used according to the actual condition of battery 3, and the inclusion of the OCV in the first range is more correctly determined. By appropriately updating the ΔOCV characteristic and the second range, the second range is used according to the change with time of the battery 3, and the inclusion of the OCV in the first range is more correctly determined. Thus, the management device can estimate the storage amount of the battery 3 with higher accuracy.

Third Embodiment

As described above, sometimes the second range varies depending on the energization rate of the energy storage device when the OCV is included in the first range. A third embodiment illustrates a mode in which the SOC is estimated using the second range corresponding to the energization rate.

Figure 17:
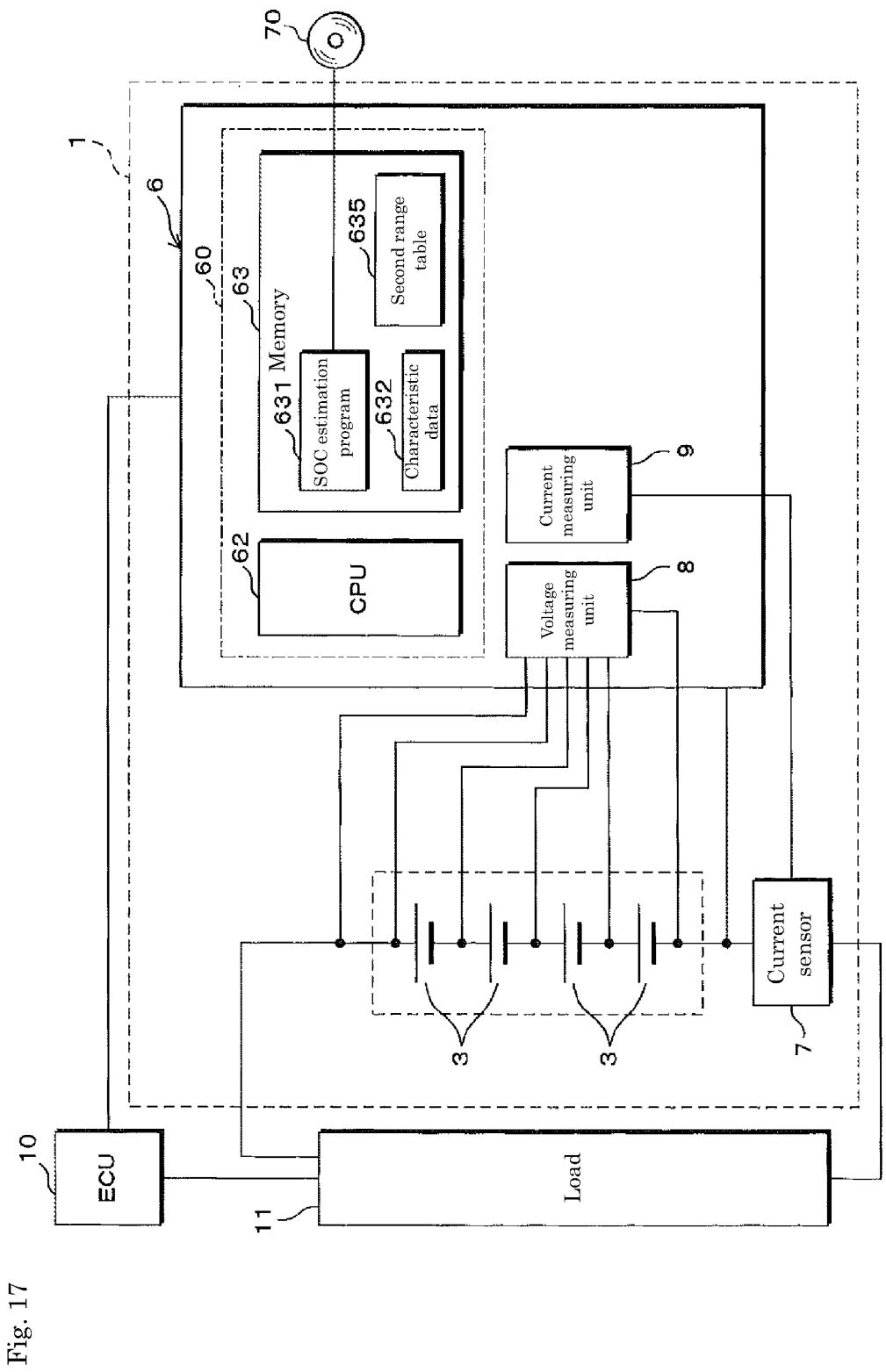
FIG. 17 is a block diagram illustrating a battery module according to a third embodiment.

FIG. 17 is a block diagram illustrating the battery module 1 of the third embodiment. The memory 63 stores a second range table 635. In the second range table 635, range information indicating the second range is recorded for each energization rate of the battery 3. For example, the range information is recorded in the second range table 635 in association with each of a plurality of rate values. Other configurations of the battery module 1 are the same as those of the first embodiment.

Figure 18:
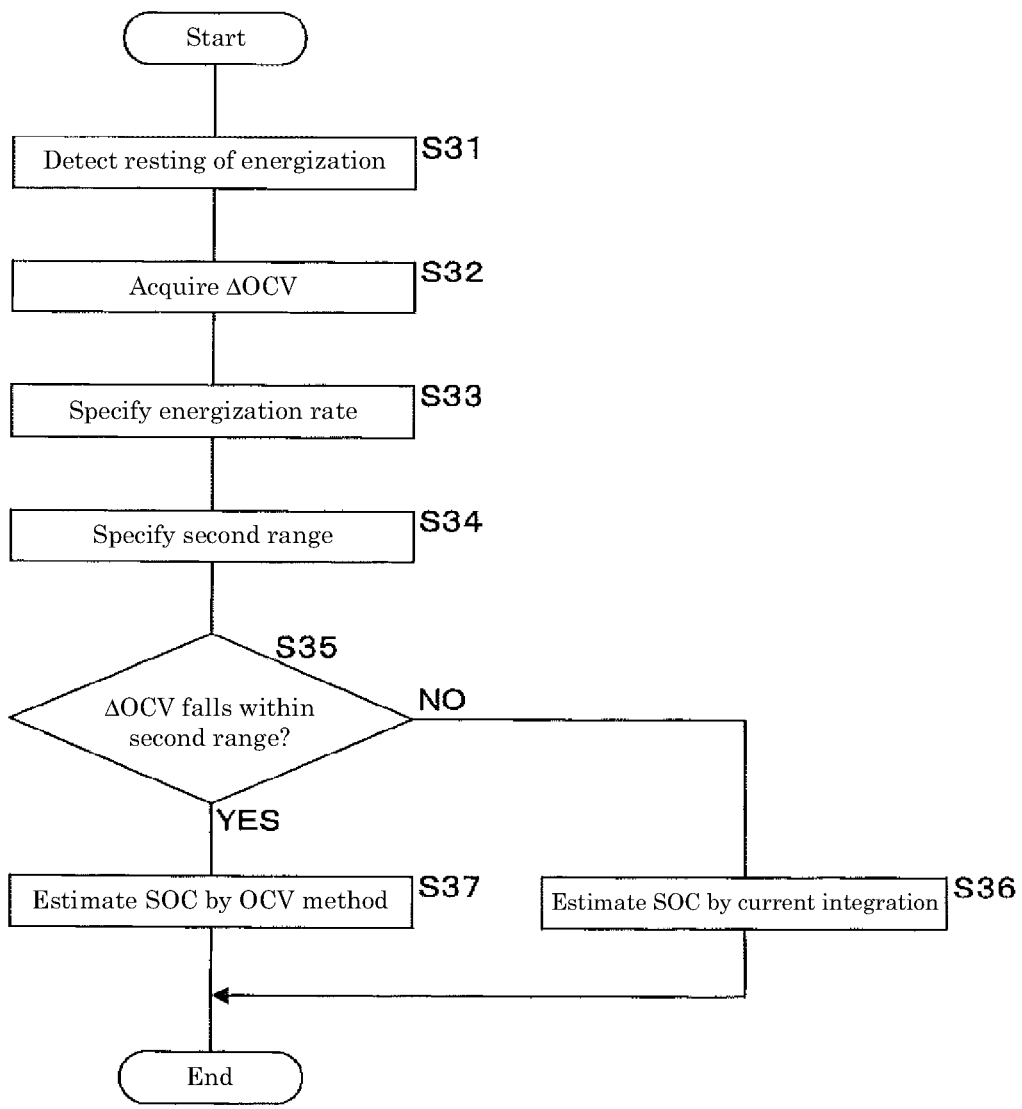
FIG. 18 is a flowchart illustrating a procedure of storage amount estimation processing performed by an information processor of the third embodiment.

FIG. 18 is a flowchart illustrating a procedure of storage amount estimation processing performed by the information processor 60 of the third embodiment. The CPU 62 performs the following processing according to the program 631.

The CPU 62 detects that the energization of the battery 3 is rested during the operation of the battery 3 (S31), and acquires the ΔOCV (S32). The processing in S32 corresponds to the acquisition unit.

The CPU 62 specifies the rate of the energization rested in S31 (S33). For example, the CPU 62 specifies the energization rate based on the measurement results of the voltage measuring unit 8 and the current measuring unit 9 during the energization. Alternatively, for example, the CPU 62 specifies the energization rate based on a control signal during the energization.

The CPU 62 specifies the second range according to the specified energization rate (S34). In S34, the CPU 62 reads the range information recorded in in the second range table 635 stored in the memory 63, the range information being associated with the specified energization rate. The CPU 62 specifies the second range as the second range indicated by the read range information. Even if the range information associated with the specified energization rate is not recorded, the CPU 62 may perform processing of specifying the second range according to the specified energization rate by an interpolation method based on the range information recorded in the second range table 635.

The CPU 62 determines whether the acquired ΔOCV is included in the specified second range (S35). The processing in S35 corresponds to the determination unit. When the ΔOCV is not included in the second range (NO in S35), the CPU 62 estimates the SOC of the battery 3 by the current integration (S36), and ends the processing. The CPU 62 performs the SOC estimation method in the case of detecting that the OCV of the battery 3 is not included in the first range in response to the fact that the ΔOCV is not included in the second range in S35 and the case where the OCV is not included in the first range in S36.

When the ΔOCV is included in the second range (YES in S35), the CPU 62 estimates the SOC of the battery 3 by the OCV method (S37), and ends the processing.

The CPU 62 performs the SOC estimation method in the case of detecting that the OCV of the battery 3 is included in the first range in response to the fact that the ΔOCV is included in the second range in S35 and the case where the OCV is included in the first range in S37. In S37, the CPU 62 regards the OCVx as the OCV, and estimates the SOC corresponding to the OCV based on the storage amount-voltage characteristic indicated by the characteristic data 632. The CPU 62 may perform the processing in S36 when the value of the SOC corresponding to the first range cannot be estimated in S37. A part or all of the pieces of processing in S31 to S37 may be performed by the hardware.

Similarly to the second embodiment, the information processor 60 may store the ΔOCV characteristic data in which the ΔOCV characteristic is recorded in the memory 63. In this case, the memory 63 stores the ΔOCV characteristic data for each energization rate. The CPU 62 specifies the second range from the ΔOCV characteristic data for each energization rate, and records the range information indicating the specified second range in the second range table 635 in association with the energization rate. The information processor 60 may appropriately update the ΔOCV characteristic data and the range information indicating the second range.

Also in the second embodiment, the information processor 60 estimates the SOC of the battery 3 by the OCV method in the case where the ΔOCV is included in the second range while the OCV is included in the first range. Thus, the management device can accurately estimate the storage amount of the battery 3 having the hysteresis of the storage amount-voltage characteristic. The management device can accurately estimate the storage amount of the high-capacity battery 3.

The information processor 60 specifies the second range according to the actual energization rate based on the second range determined for each energization rate, and estimates the storage amount using the specified second range. Sometimes the second range varies depending on the energization rate of the battery 3 when the OCV is included in the first range, so that the inclusion of the OCV in the first range is more correctly determined using the second range corresponding to the energization rate. Thus, the management device can estimate the storage amount of the battery 3 with higher accuracy.

Fourth Embodiment

Sometimes the first range changes according to degradation of the energy storage device. A fourth embodiment illustrates a mode in which the SOC is estimated using the first range corresponding to the degradation of the energy storage device.

Figure 19:
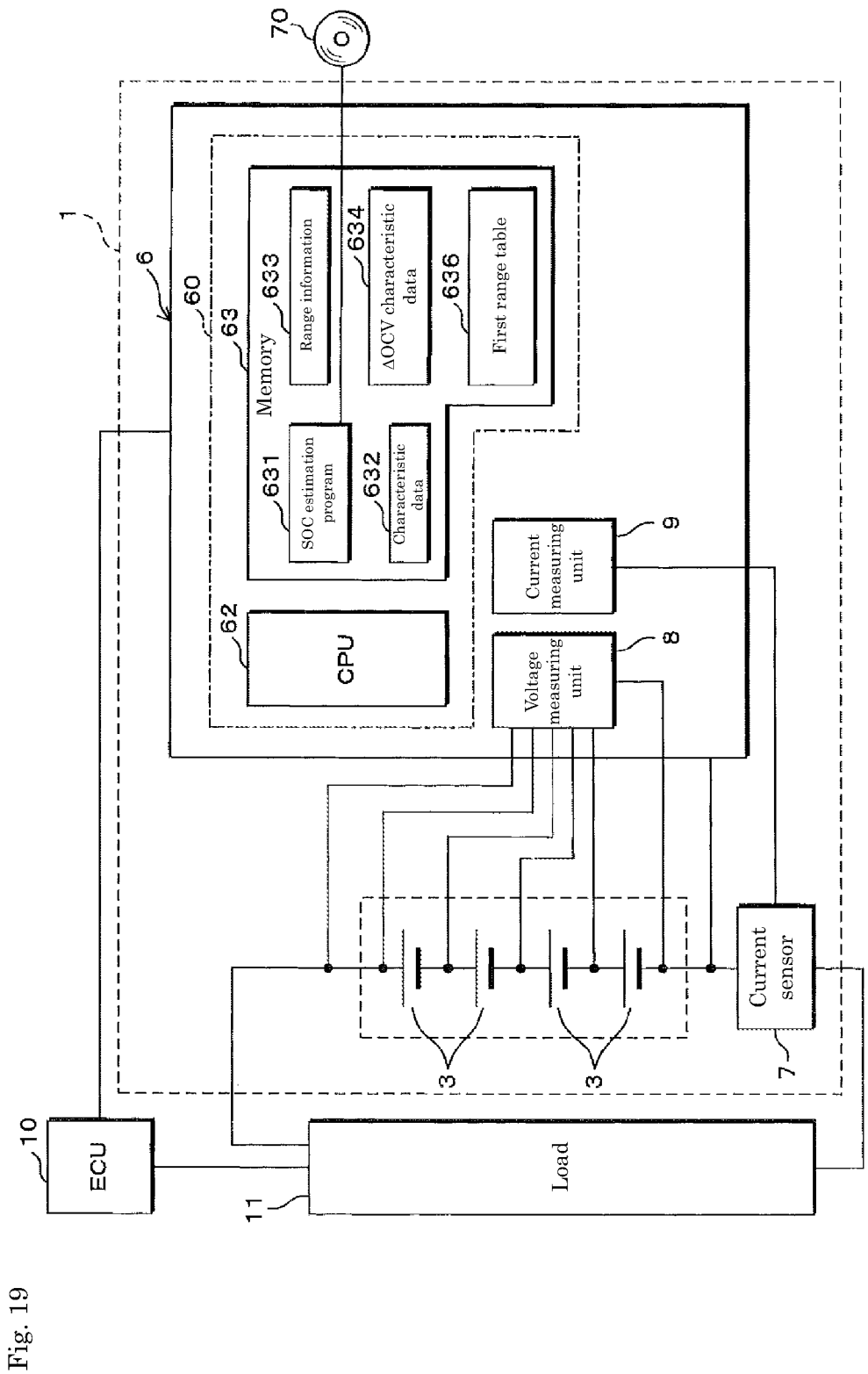
FIG. 19 is a block diagram illustrating a battery module according to a fourth embodiment.

FIG. 19 is a block diagram illustrating the battery module 1 of the fourth embodiment. The memory 63 stores the program 631, the characteristic data 632, the range information 633, the characteristic data 634, and a first range table 636. In the first range table 636, the first range is recorded in association with a degree of degradation of the battery 3. Other configurations of the battery module 1 are the same as those of the first embodiment.

Figure 20:
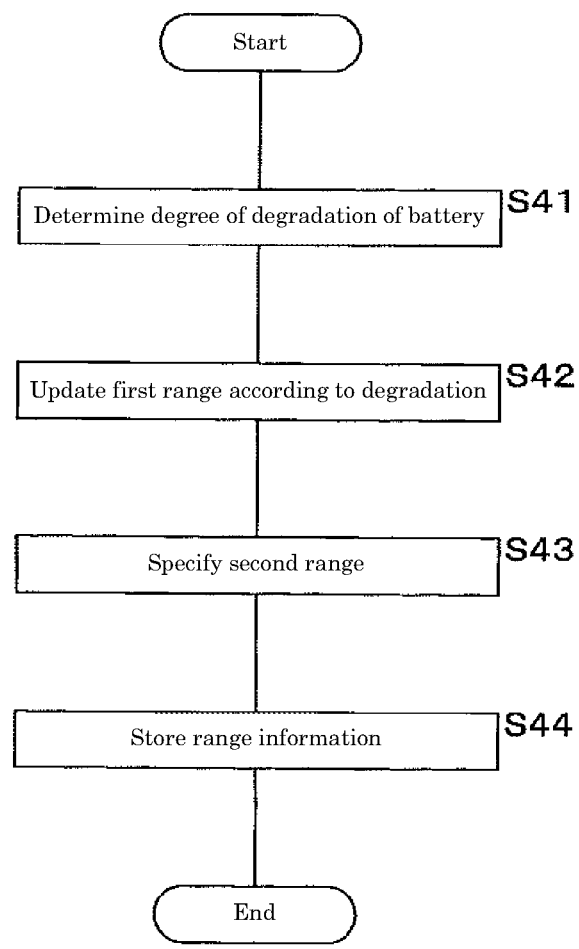
FIG. 20 is a flowchart illustrating a procedure of second range specifying processing performed by an information processor of the fourth embodiment.

FIG. 20 is a flowchart illustrating a procedure of second range specifying processing performed by the information processor 60 of the fourth embodiment. The CPU 62 performs the following processing according to the program 631.

The CPU 62 determines the degree of degradation of the battery 3 at appropriate timing (S41). For example, similarly to the second embodiment, the CPU 62 acquires the ΔOCV characteristic that is the relationship between the SOC or OCV and ΔOCV when the battery 3 is energized at a constant rate, and stores the characteristic data 634 in which the ΔOCV characteristic is recorded in the memory 63, and performs the processing in S41. For example, the CPU 62 performs the processing in S41 every time a specific period elapses, every time the battery 3 is energized a specific number of times, or every time the battery 3 is energized for a predetermined time. In S41, the CPU 62 determines the degree of degradation of the battery 3 by a predetermined specific method.

Based on the first range table 636, the CPU 62 updates the first range according to the degradation of the battery 3 (S42). In S42, the CPU 62 updates the first range by reading the first range recorded in association with the determined degree of degradation from the first range table 636 stored in the memory 63. The pieces of processing in S41 to S42 corresponds to the update unit.

Based on the characteristic data 634 stored in the memory 63, the CPU 62 specifies the second range when the OCV is included in the first range (S43). In S43, the CPU 62 acquires the ΔOCV corresponding to the OCV included in the updated first range or the ΔOCV corresponding to the SOC included in the first range from the ΔOCV characteristic, and specifies the range of the acquired ΔOCV. The processing in S43 corresponds to the specification unit.

The CPU 62 stores the range information 633 indicating the specified second range in the memory 63 (S44), and ends the processing. The information processor 60 appropriately repeats the pieces of processes in S41 to S44. For example, the information processor 60 performs the pieces of processing in S41 to S44 every time the processing of acquiring the ΔOCV characteristic to store the characteristic data 634 in the memory 63 is performed.

Similarly to the first embodiment, the information processor 60 performs the storage amount estimation processing in S11 to S15. Consequently, also in the second embodiment, the information processor 60 estimates the SOC of the battery 3 by the OCV method in the case where the ΔOCV is included in the second range while the OCV is included in the first range where the difference between the OCV during the discharge and the OCV during the charge decreases. The CPU 62 may perform the pieces of processing in S41 to S44 immediately before the processing in S13.

Similarly to the third embodiment, the information processor 60 may estimate the storage amount using the second range for each energization rate. In this case, the memory 63 stores the second range table 635. The CPU 62 performs the pieces of processing in S41 to S44 for each energization rate of the battery 3, and records the range information indicating the specified second range in the second range table 635 in association with the energization rate in S44. The information processor 60 performs the storage amount estimation processing in S31 to S37. In the storage amount estimation processing, the CPU 62 may perform processing of specifying the second range corresponding to the energization rate by the interpolation method or the like based on the recorded range information even if the range information associated with the specified energization rate is not recorded in the second range table 635.

Also in the second embodiment, the information processor 60 estimates the SOC of the battery 3 by the OCV method in the case where the ΔOCV is included in the second range while the OCV is included in the first range. Thus, the management device can accurately estimate the storage amount of the battery 3 having the hysteresis of the storage amount-voltage characteristic. The management device can accurately estimate the storage amount of the high-capacity battery 3.

The information processor 60 estimates the storage amount after updating the first range according to the degradation of the battery 3. Sometimes the first range changes according to the degradation of the battery 3, so that the second range is more correctly specified using the first range corresponding to the degradation of the battery 3 when the OCV is included in the first range. The inclusion of the OCV in the first range is more correctly determined using the second range more accurately specified. Thus, the management device can estimate the storage amount of the battery 3 with higher accuracy.

Fifth Embodiment

A fifth embodiment illustrates a mode in which the SOC is estimated using the first range corresponding to the degradation of the energy storage device.

Figure 21:
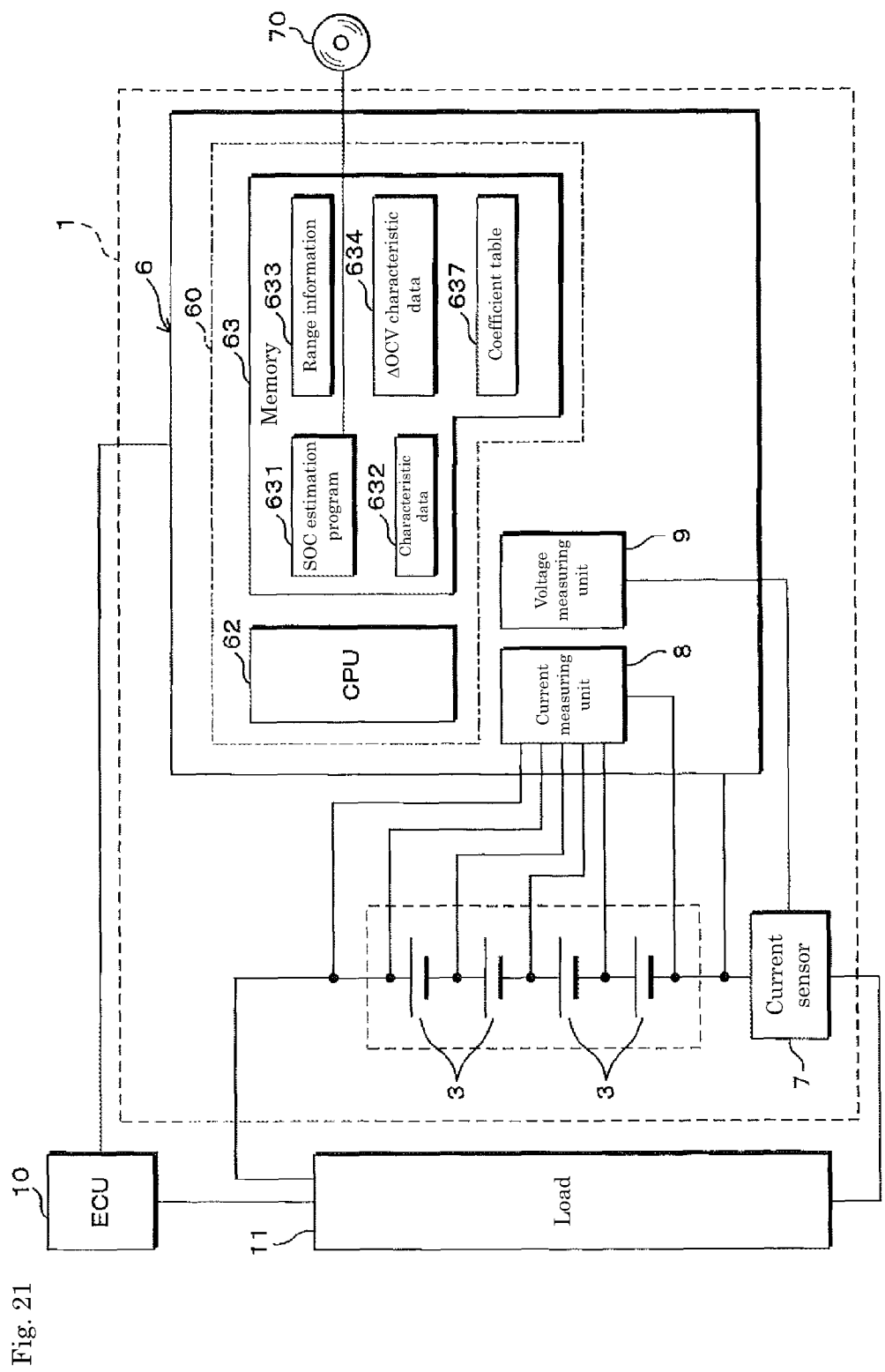
FIG. 21 is a block diagram illustrating a battery module according to a fifth embodiment.

FIG. 21 is a block diagram of the battery module 1. The memory 63 stores the program 631, the characteristic data 632, the range information 633, the characteristic data 634, and a coefficient table 637. In the coefficient table 637, a coefficient obtaining the post-degradation first range by multiplying the pre-degradation first range is recorded in association with the degree of degradation of the battery 3. Other configurations of the battery module 1 are the same as those of the first embodiment.

The information processor 60 specifies the second range by the pieces of processing in S41 to S44 in FIG. 20. The CPU 62 determines the degree of degradation of the battery 3 at appropriate timing (S41), and updates the first range according to the degradation of the battery 3 based on the coefficient table 637 (S42). In S42, the CPU 62 reads the coefficient recorded in association with the determined degree of degradation from the coefficient table 637 stored in the memory 63, and updates the first range by multiplying the read coefficient by the value of the predetermined pre-degradation first range.

Based on the characteristic data 634 stored in the memory 63, the CPU 62 specifies the second range when the OCV is included in the first range (S43), stores the range information 633 indicating the specified second range in the memory 63 (S44), and ends the processing. The information processor 60 appropriately repeats the pieces of processes in S41 to S44. For example, the information processor 60 performs the pieces of processing in S41 to S44 every time the processing of acquiring the ΔOCV characteristic to store the characteristic data 634 in the memory 63 is performed.

Similarly to the first embodiment, the information processor 60 performs the storage amount estimation processing in S11 to S15. The CPU 62 may perform the pieces of processing in S41 to S44 immediately before the processing in S13.

Similarly to the third embodiment, the information processor 60 may store the second range table 635 in the memory 63, and estimate the storage amount of using the second range of another energization rate. In this case, the CPU 62 performs the pieces of processing in S41 to S44 for each energization rate of the battery 3, and records the range information indicating the specified second range in the second range table 635 in association with the energization rate in S44. The information processor 60 performs the storage amount estimation processing in S31 to S37. In the storage amount estimation processing, the CPU 62 may perform processing of specifying the second range corresponding to the energization rate by the interpolation method or the like based on the recorded range information even if the range information associated with the specified energization rate is not recorded in the second range table 635.

Also in the fifth embodiment, the information processor 60 estimates the SOC of the battery 3 by the OCV method in the case where the ΔOCV is included in the second range while the OCV is included in the first range where the difference between the OCV during the discharge and the OCV during the charge decreases. Thus, the management device can accurately estimate the storage amount of the battery 3 having the hysteresis of the storage amount-voltage characteristic. The management device can accurately estimate the storage amount of the high-capacity battery 3.

The information processor 60 estimates the storage amount after updating the first range in which the difference between the OCV during the discharge and the OCV during the charge decreases according to the degradation of the battery 3. The second range is more accurately specified using the first range corresponding to the degradation of the battery 3 when the OCV is included in the first range. The inclusion of the OCV in the first range is more correctly determined using the second range more accurately specified. Thus, the management device can estimate the storage amount of the battery 3 with higher accuracy.

The present invention is not limited to the contents of the above embodiment, but various modifications can be made within the scope of the claims. That is, an embodiment obtained by combining technical means appropriately changed within the scope of the claims is also included in the technical scope of the present invention. The scope of the present invention is illustrated by the scope of the claims, and is intended to include all changes within the scope of the claims and meaning equivalent to the scope of the claims.

By way of example, the management device is applied to the in-vehicle lithium ion secondary battery. Alternatively, the present invention can also be applied to industrial energy storage modules such as a power leveling energy storage apparatus, a railway regenerative power storage device, and a solar power generating system. The voltage between the positive electrode terminal and the negative electrode terminal of the energy storage device can be regarded as the OCV in the energy storage module through which a minute current flows. The energy storage device is not limited to the lithium ion secondary battery, but may be another secondary battery or an electrochemical cell having the hysteresis of the storage amount-voltage characteristic.

By way of example, the monitoring device 100 or the BMU 6 is a management device. Alternatively, a cell monitoring unit (CMU) may be the management device. The management device may be a part of the energy storage module in which the monitoring device 100 or the like is incorporated. The management device may be configured separately from the energy storage device or the energy storage module, and connected to the energy storage module including the energy storage device that is the estimation target of the storage amount during the estimation of the storage amount. The management device may remotely monitor the energy storage device and the energy storage module.

The present invention can be applied to the management of the energy storage device such as a lithium ion secondary battery.

DESCRIPTION OF REFERENCE SIGNS 1, 50 battery module (energy storage module)
200 energy storage device
3 battery (energy storage device)
31 case
32 terminal
33 electrode assembly
4 bus bar
5 external terminal
6 BMU (management device)
60 information processor
62 CPU
63 memory (first storage unit, second storage unit)
631 program (computer program)
70 recording media
7 current sensor
8 voltage measuring unit
9 current measuring unit
10 ECU
100 monitoring device (management device)

The invention claimed is:

1. A management device comprising:
a processing unit that, based upon a measurement result of a current measuring unit, either directly or indirectly, via an electronic control unit, rests an energization of an energy storage device;
an acquisition unit that, based on measurement results obtained by a voltage measurement unit and the current measuring unit, acquires a change amount between a voltage of the energy storage device when the energization is rested from a state in which the energy storage device is energized and a voltage when a period elapses; and
a determination unit that determines whether the change amount is included in a second range corresponding to a first range where a difference in voltage between a storage amount-voltage characteristic during charge and a storage amount-voltage characteristic during discharge with respect to an identical storage amount is smaller than a hysteresis range.

2. The management device according to claim 1, further comprising an estimation unit that estimates the storage amount of the energy storage device based on the storage amount-voltage characteristics when the change amount is determined to be included in the second range.

3. The management device according to claim 2, further comprising a first storage unit that stores the second range for each energization rate of the energy storage device, wherein the determination unit specifies the second range corresponding to the energization rate stored in the first storage unit, and determines whether the change amount is included in the second range.

4. The management device according to claim 2, wherein the estimation unit estimates the storage amount of the energy storage device after a quick charge of the energy storage device.

5. The management device according to claim 3, wherein:
the processing unit further, either directly or indirectly, performs the energization of the energy storage device at a predetermined rate and rests the energization every time the storage amount changes by a predetermined amount, the acquisition unit further acquires the change amount between the voltage of the energy storage device when the energization is rested and the voltage when the period elapses, and a second storage unit stores a change amount characteristic indicating a relationship between the storage amount or the voltage and the change amount;
a specification unit specifies the second range based on the change amount characteristic; and
first storage unit stores the specified second range.

6. The management device according to claim 3, wherein the estimation unit estimates the storage amount of the energy storage device after a quick charge of the energy storage device.

7. The management device according to claim 5, further comprising an update unit that updates the first range according to degradation of the energy storage device, wherein:
the specification unit updates the second range by specifying the second range corresponding to the first range updated by the update unit based on the change amount characteristic,
the first storage unit stores the second range updated by the specification unit, and
the estimation unit estimates the storage amount of the energy storage device based on the second range.

8. The management device according to claim 5, wherein the estimation unit estimates the storage amount of the energy storage device after a quick charge of the energy storage device.

9. The management device according to claim 7, wherein the estimation unit estimates the storage amount of the energy storage device after a quick charge of the energy storage device.

10. An energy storage module comprising:
an energy storage device; and
the management device according to claim 1.

11. A computer-implemented management method comprising:
resting an energization of an energy storage device via a processor or an electronic controller and based upon a measurement result of a current measuring unit;
acquiring, via the processor and based on measurement results obtained by a voltage measurement unit and the current measuring unit, a change amount between a voltage of the energy storage device when the energization is rested from a state in which the energy storage device is energized and a voltage when a period elapses; and
determining, via the processor, whether the change amount is included in a second range corresponding to a first range where a difference in voltage between a storage amount-voltage characteristic during charge and a storage amount-voltage characteristic during discharge with respect to an identical storage amount is smaller than a hysteresis range.

12. A computer program product comprising a non-transitory computer-readable medium having computer program instructions stored therein, the computer program instructions, when executed by a processor, causing the processor to:
resting, directly or via an electronic controller and based upon a measurement result of a current measuring unit, an energization of an energy storage device;

acquiring a change amount between a voltage of the energy storage device when the energization is rested from a state in which the energy storage device is energized and a voltage when a period elapses; and determining whether the change amount is included in a second range corresponding to a first range where a difference in voltage between a storage amount-voltage characteristic during charge and a storage amount-voltage characteristic during discharge with respect to an identical storage amount is smaller than a hysteresis range.

* * * * *

UNITED STATES PATENT AND TRADEMARK OFFICE
CERTIFICATE OF CORRECTION

PATENT NO. : 11,079,440 B2  
APPLICATION NO. : 16/618475  
DATED : August 3, 2021  
INVENTOR(S) : Ideka et al.

Page 1 of 1

It is certified that error appears in the above-identified patent and that said Letters Patent is hereby corrected as shown below:

In the Claims

<u>Column 22</u>  
Line 12, Claim 5 "first storage unit stores the specified second range." should read --the first storage unit stores the specified second range.--

Signed and Sealed this  
Fourteenth Day of December, 2021

Drew Hirshfeld  
*Performing the Functions and Duties of the*  
*Under Secretary of Commerce for Intellectual Property and*  
*Director of the United States Patent and Trademark Office*